(12) United States Patent
Tsai et al.

(10) Patent No.: US 12,074,218 B2
(45) Date of Patent: Aug. 27, 2024

(54) CONTACT STRUCTURE WITH INSULATING CAP

(71) Applicant: Taiwan Semiconductor Manufacturing Company, Ltd., Hsinchu (TW)

(72) Inventors: Kuo-Chiang Tsai, Hsinchu (TW); Fu-Hsiang Su, Zhubei (TW); Yi-Ju Chen, Tainan (TW); Jyh-Huei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 701 days.

(21) Appl. No.: 17/201,650

(22) Filed: Mar. 15, 2021

(65) Prior Publication Data

US 2021/0202734 A1 Jul. 1, 2021

Related U.S. Application Data

(63) Continuation of application No. 16/171,763, filed on Oct. 26, 2018, now Pat. No. 10,950,729.

(51) Int. Cl.
| | |
|---|---|
| *H01L 29/78* | (2006.01) |
| *H01L 21/02* | (2006.01) |
| *H01L 21/768* | (2006.01) |
| *H01L 21/8234* | (2006.01) |
| *H01L 23/522* | (2006.01) |
| *H01L 29/66* | (2006.01) |

(52) U.S. Cl.
CPC ...... *H01L 29/785* (2013.01); *H01L 21/02362* (2013.01); *H01L 21/76832* (2013.01); *H01L 21/823431* (2013.01); *H01L 23/5226* (2013.01); *H01L 29/66545* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |

(Continued)

*Primary Examiner* — Bilkis Jahan
(74) *Attorney, Agent, or Firm* — Birch, Stewart, Kolasch & Birch, LLP

(57) ABSTRACT

A semiconductor device structure is provided. The semiconductor device structure includes a conductive gate stack formed over a substrate. A gate dielectric layer covers opposite sidewalls and a bottom of the conductive gate stack. A first gate spacer layer and a second gate spacer layer respectively cover portions of the gate dielectric layer corresponding to the opposite sidewalls of the conductive gate stack. A source/drain contact structure is separated from the conductive gate stack by the gate dielectric layer and the first gate spacer layer. A first insulating capping feature covers the conductive gate stack and is separated from the second gate spacer layer by the gate dielectric layer, and a second insulating capping feature covers the source/drain contact structure. An upper surface of the second insulating capping feature is substantially level with an upper surface of the first insulating capping feature.

20 Claims, 15 Drawing Sheets

(56) References Cited

U.S. PATENT DOCUMENTS

| | | |
|---|---|---|
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,425,105 B1* | 8/2016 | Basker ............ H01L 21/823821 |
| 9,520,482 B1 | 12/2016 | Chang et al. |
| 9,576,814 B2 | 2/2017 | Wu et al. |
| 2013/0175619 A1* | 7/2013 | Fan .................... H01L 27/1207 |
| | | 257/E21.409 |
| 2017/0278747 A1* | 9/2017 | Adusumilli ....... H01L 21/76897 |
| 2019/0198394 A1* | 6/2019 | Basker ................ H01L 29/4966 |

* cited by examiner

CONTACT STRUCTURE WITH INSULATING CAP

PRIORITY CLAIM AND CROSS-REFERENCE

This application is a Continuation of pending U.S. patent application Ser. No. 16/171,763, filed Oct. 26, 2018, and entitled "CONTACT STRUCTURE WITH INSULATING CAP," the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET).

FinFETs are fabricated with a thin vertical "fin" (or fin structure) extending from a substrate. The advantages of a FinFET include a reduction of the short channel effect and a higher current flow.

Although existing FinFET manufacturing processes have generally been adequate for their intended purposes, they have not been entirely satisfactory in all respects, especially as device scaling-down continues. For example, it is a challenge to form reliable via and contact structures at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
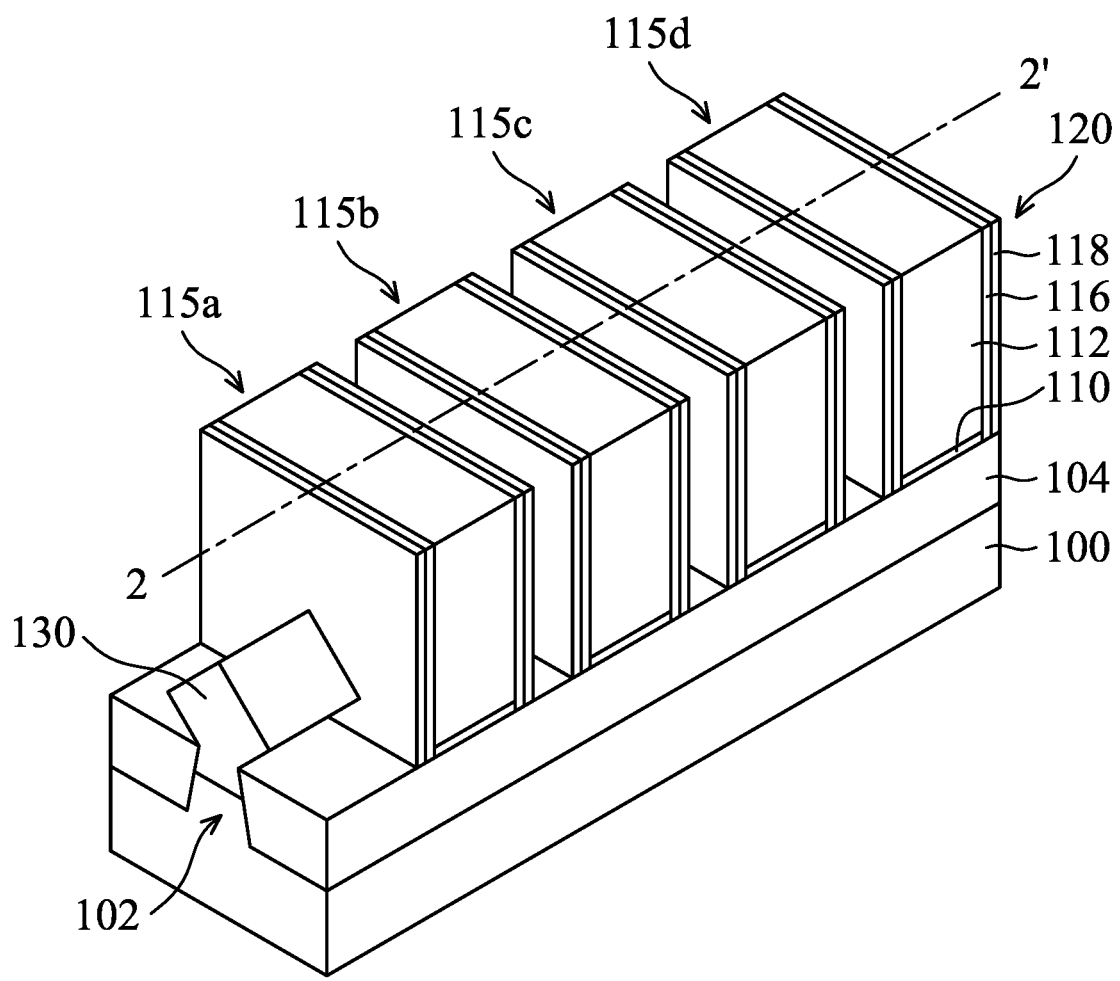
FIGS. 1A to 1D illustrate perspective views of various stages of manufacturing a semiconductor device structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments for manufacturing semiconductor device structures are provided. The semiconductor device structures may include a gate stack and an adjacent source/drain contact structure over a semiconductor substrate. A first insulating capping feature is formed over a gate stack, and a second insulating capping feature including a material that is different from the material of the first insulating capping feature is formed over the source/drain contact structure. An insulating layer is formed over the first and second insulating capping features. The second insulating capping feature provides a hard mask property during etching a via opening in the first insulating capping feature. As a result, the source/drain contact structure can be prevented from being bridged with the via structure over the gate stack. In addition, the second insulating capping feature also provides etching selectivity from the insulating layer during the etching a via opening in the insulating layer above the source/drain contact structure. Therefore, the formation of an etch stop layer between the insulating layer and the second insulating capping feature can be omitted. As a result, the etching capability for the definition of the via opening can be improved. The height of the subsequently formed via structure over the source/drain contact structure can be reduced, thereby reducing the resistance of the via structures, so that the device performance is increased.

Figure 1B:
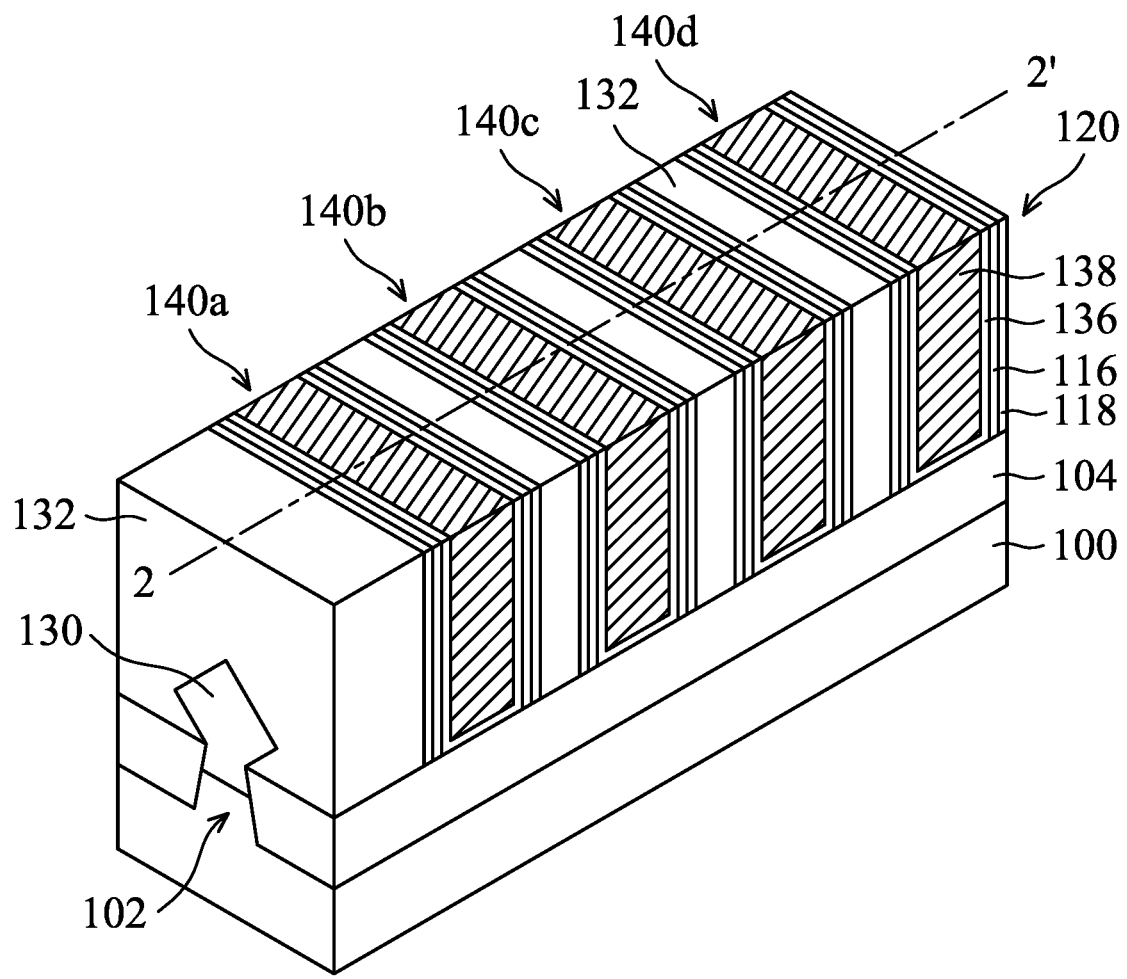
Figure 1C:
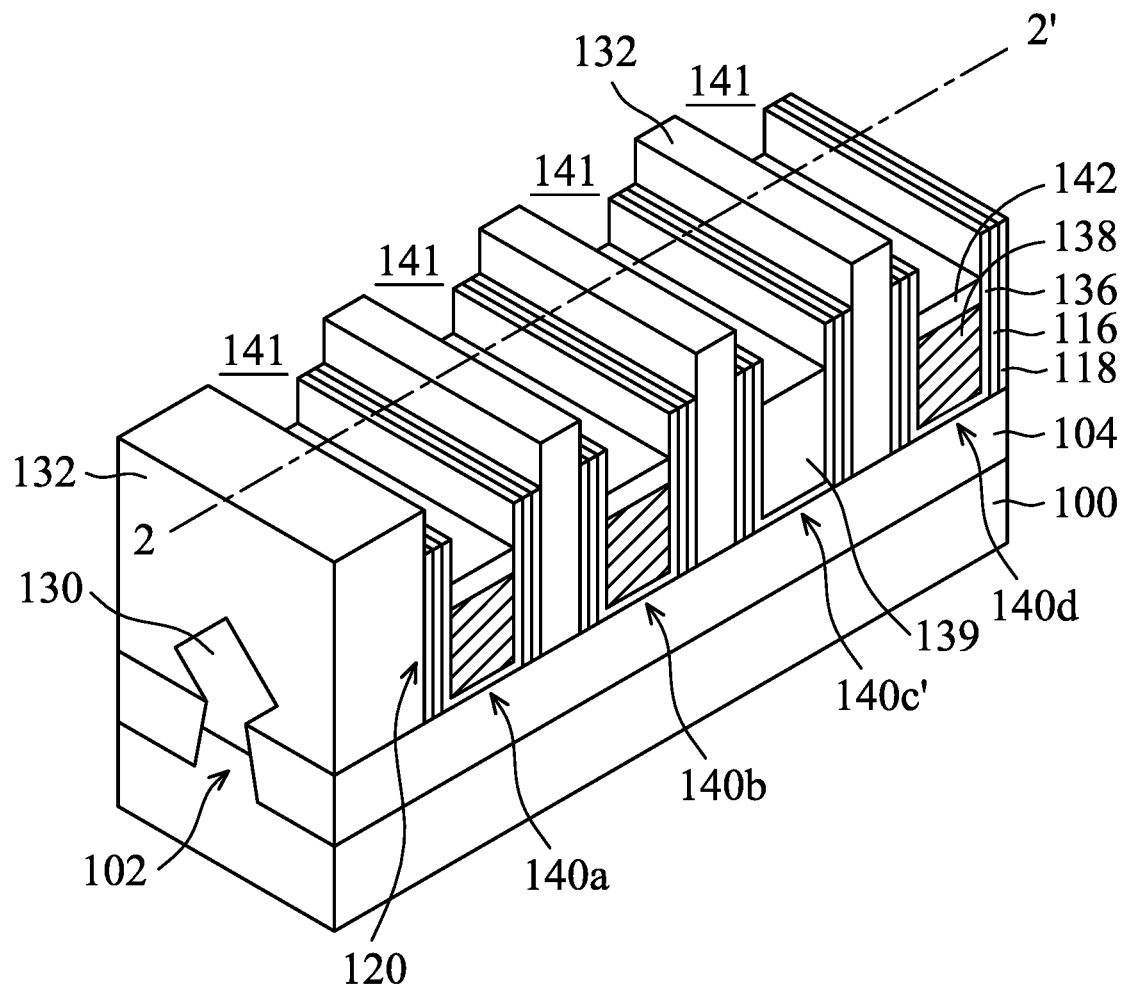
Figure 1D:
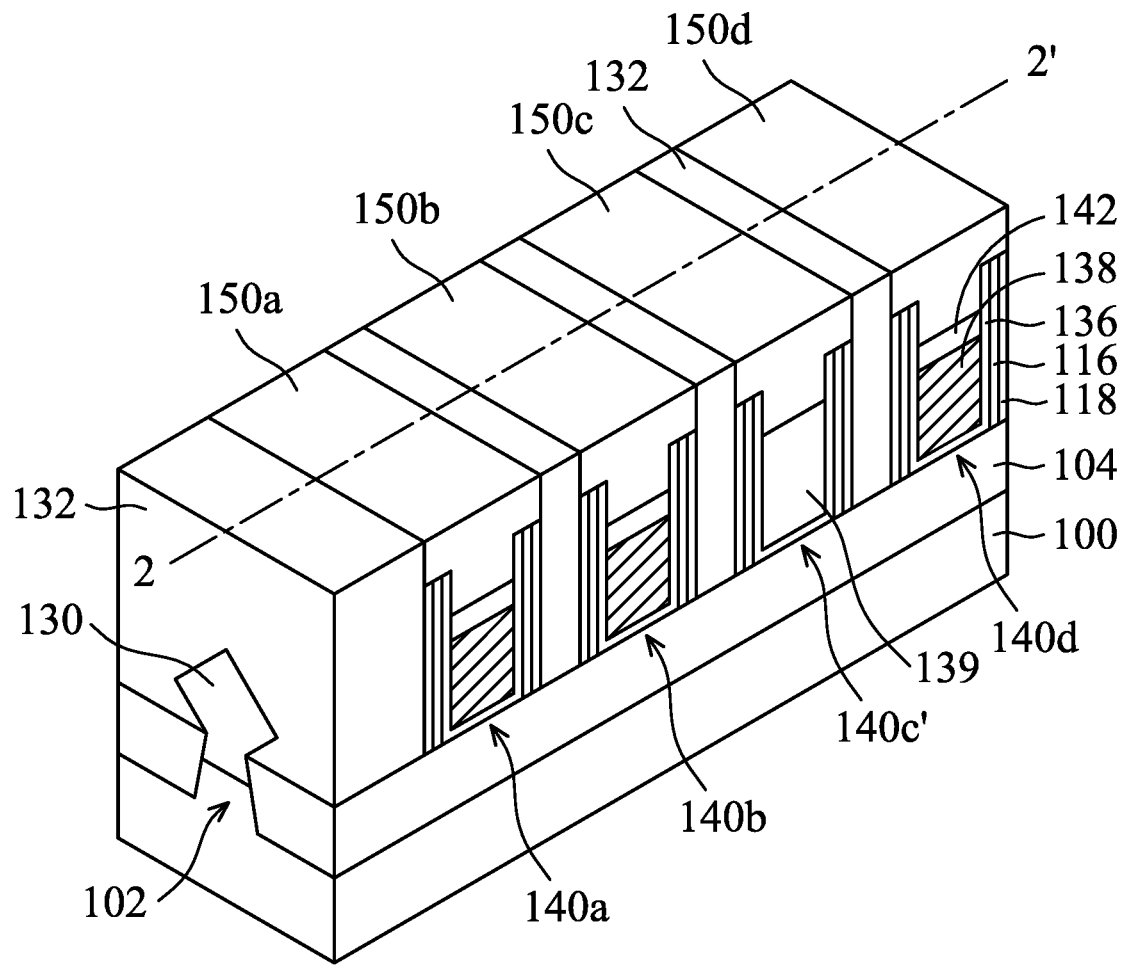
Figure 2A:
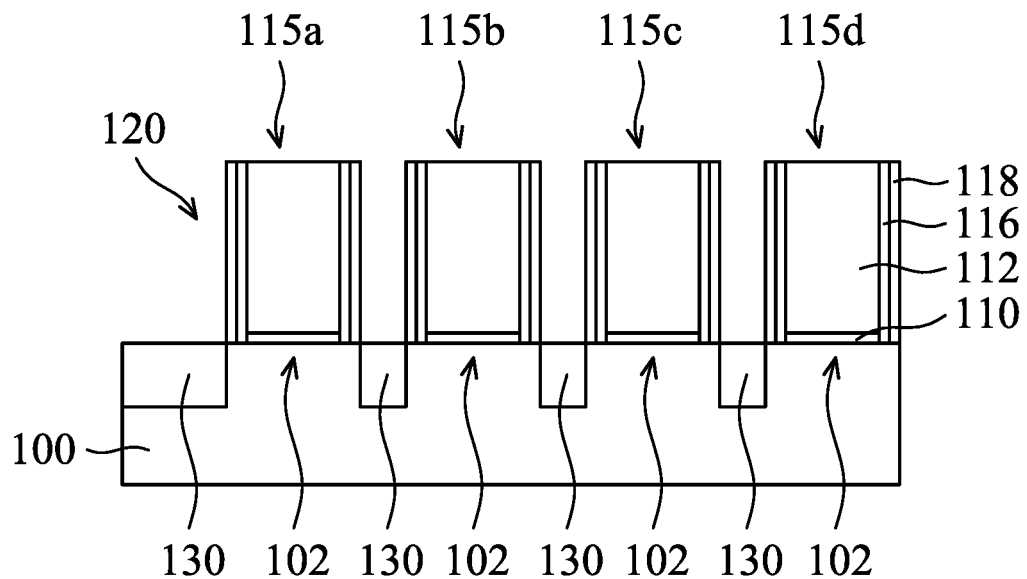
FIGS. 2A to 2Q illustrate cross-sectional representations of various stages of manufacturing a semiconductor device structure in accordance with some embodiments.
Figure 2B:
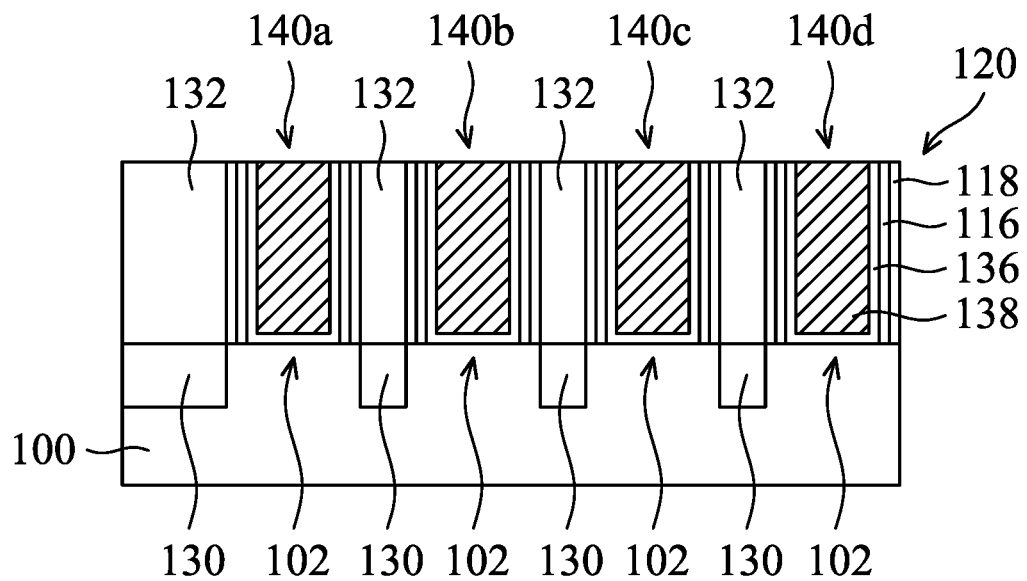
Figure 2C:
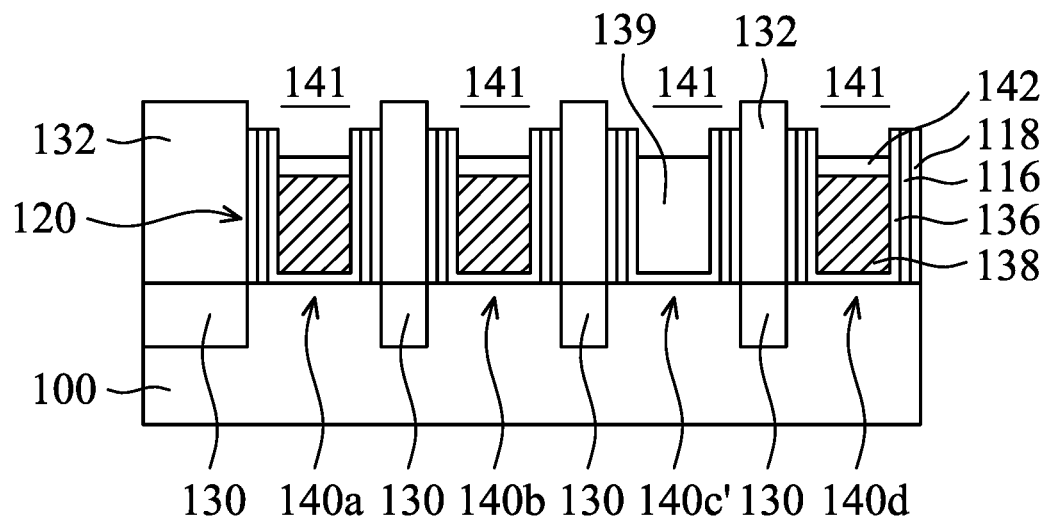
Figure 2D:
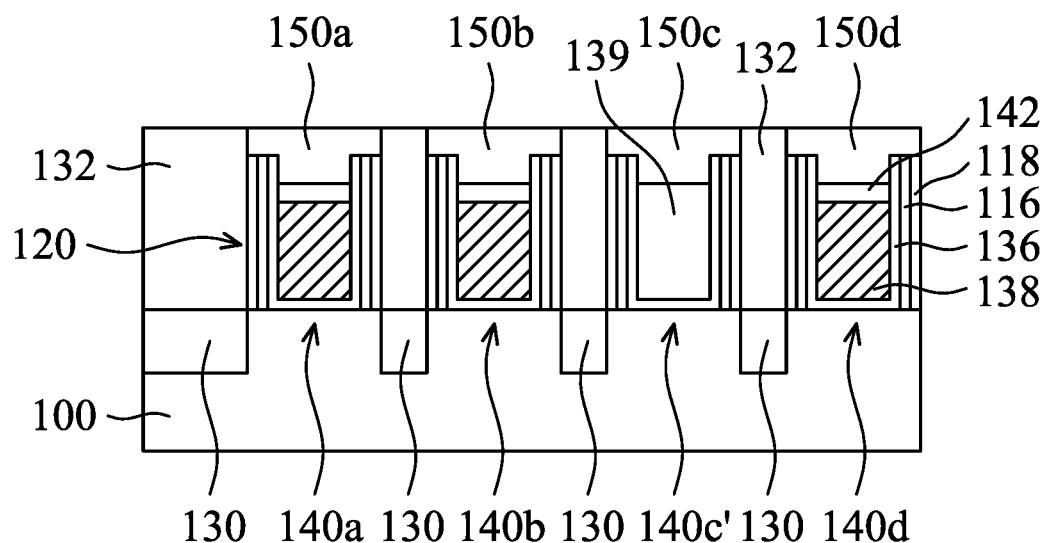
Figure 2E:
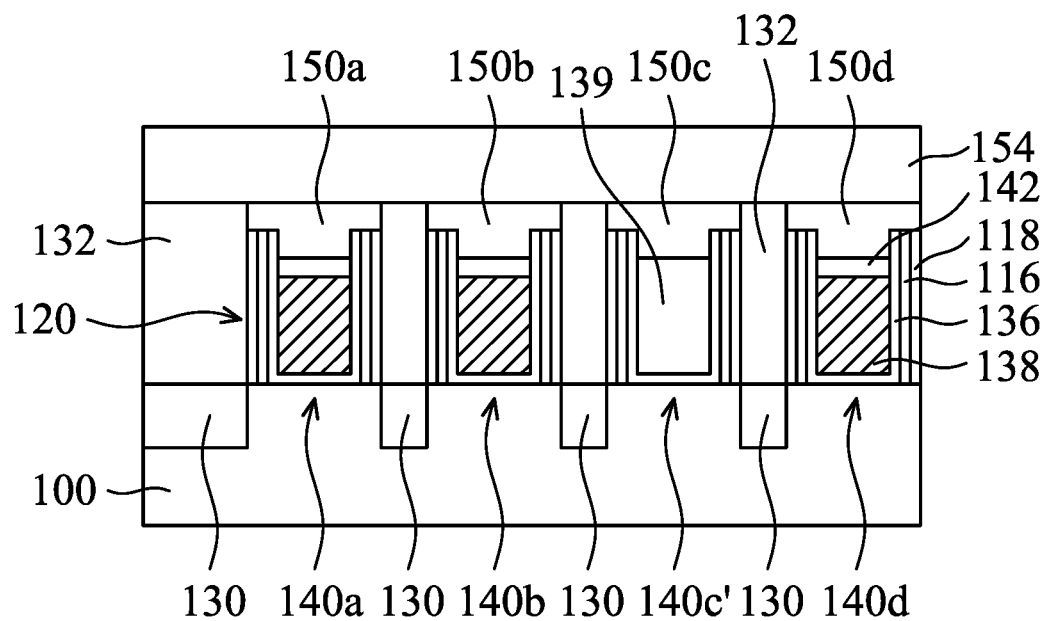
Figure 2F:
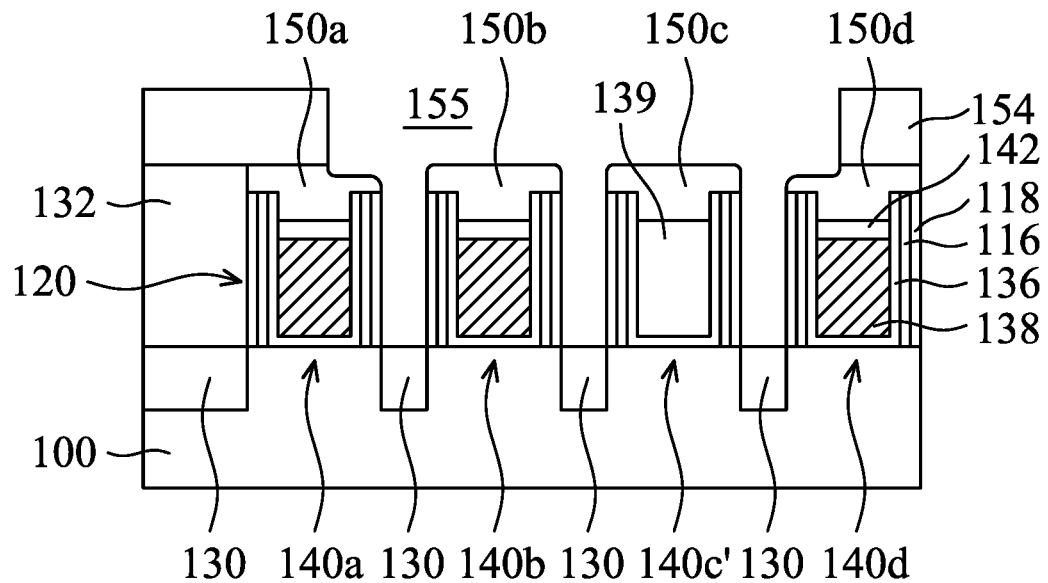
Figure 2G:
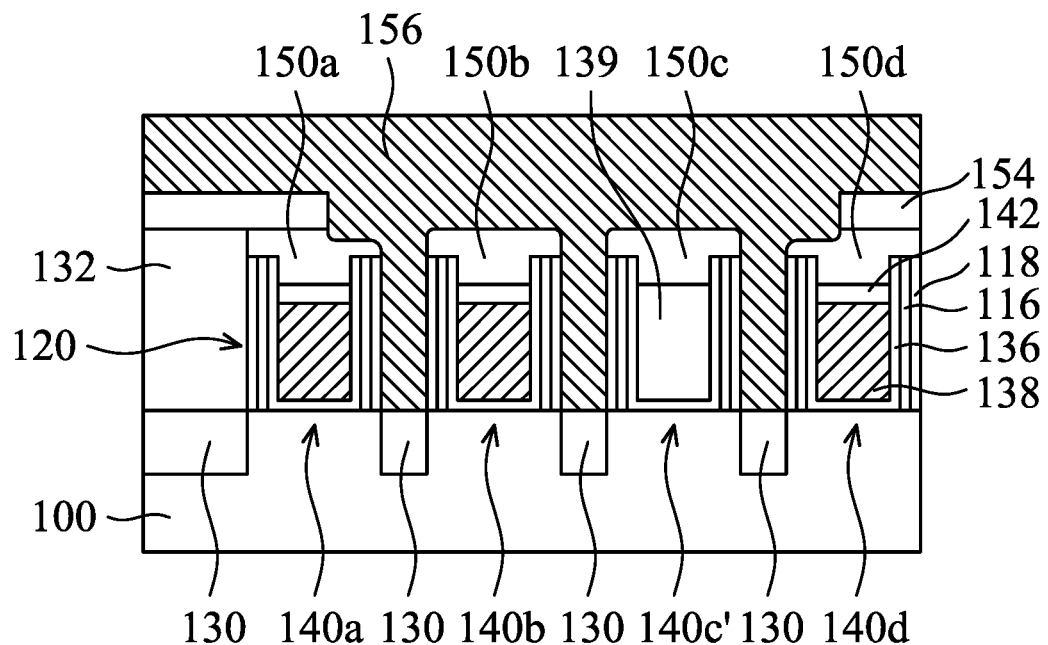
Figure 2H:
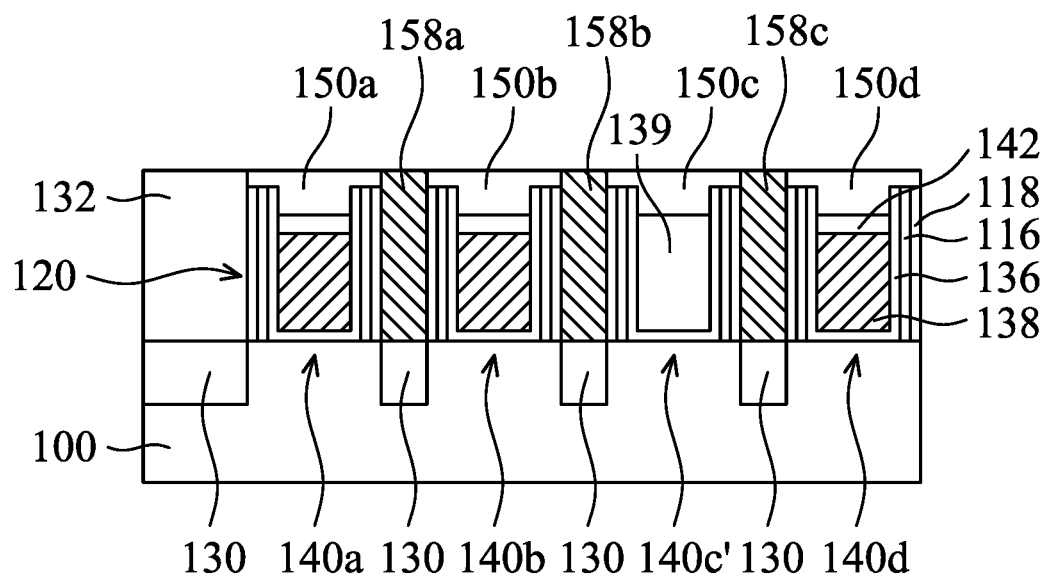
Figure 2I:
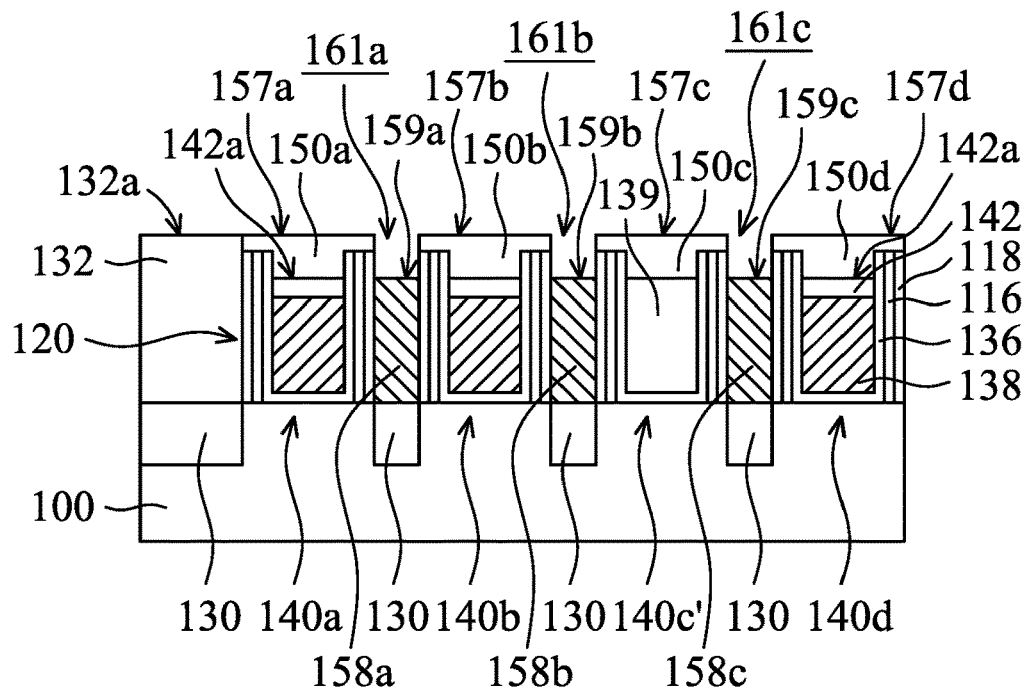
Figure 2J:
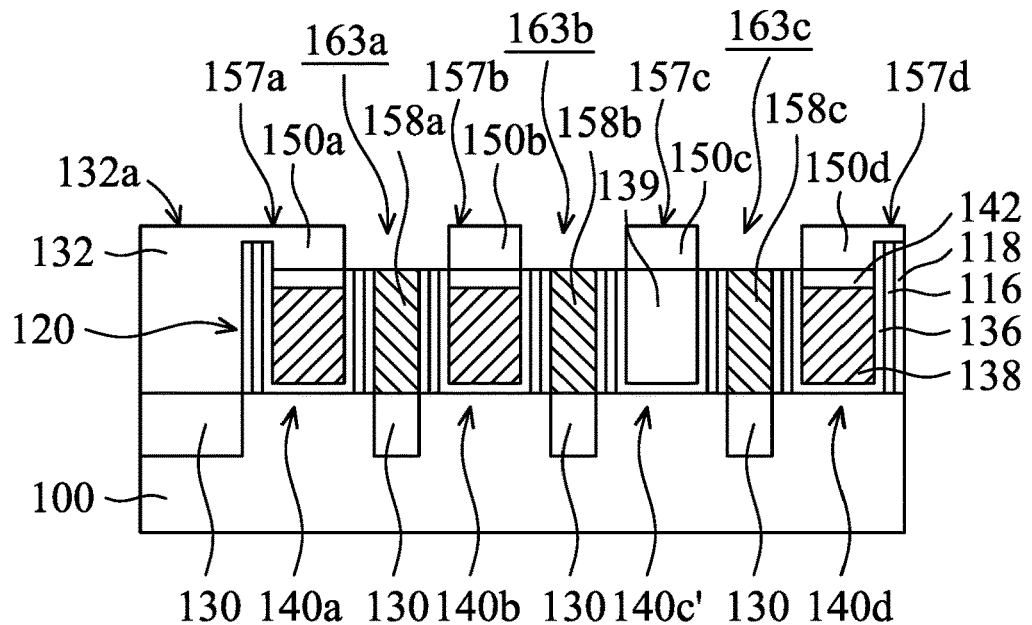
Figure 2K:
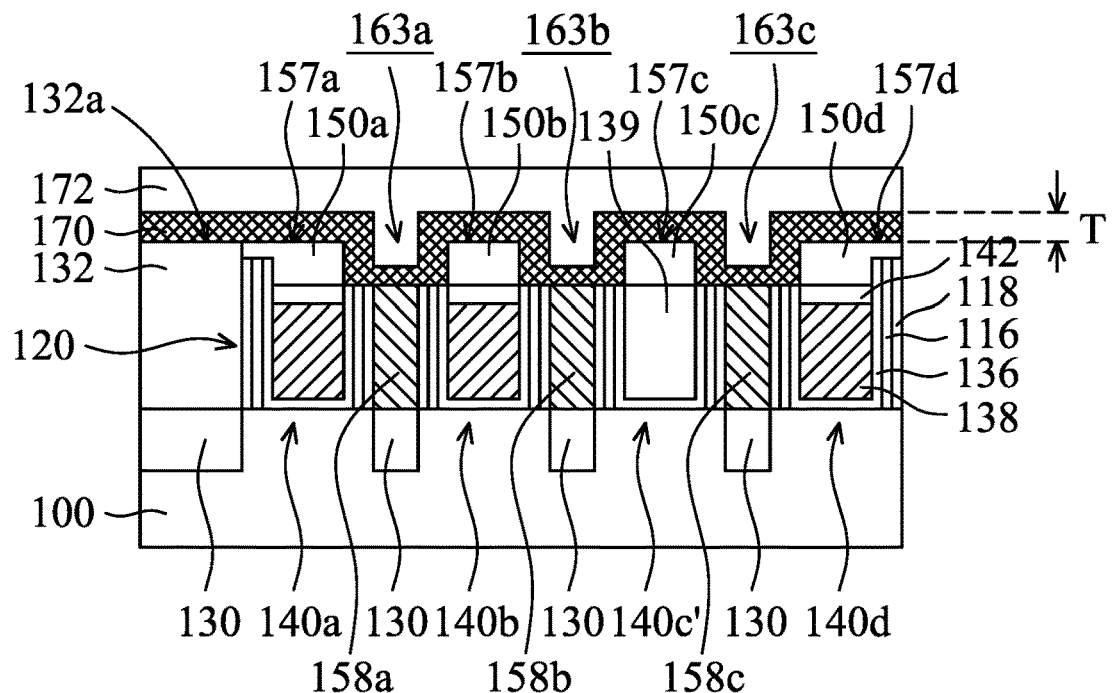
Figure 2L:
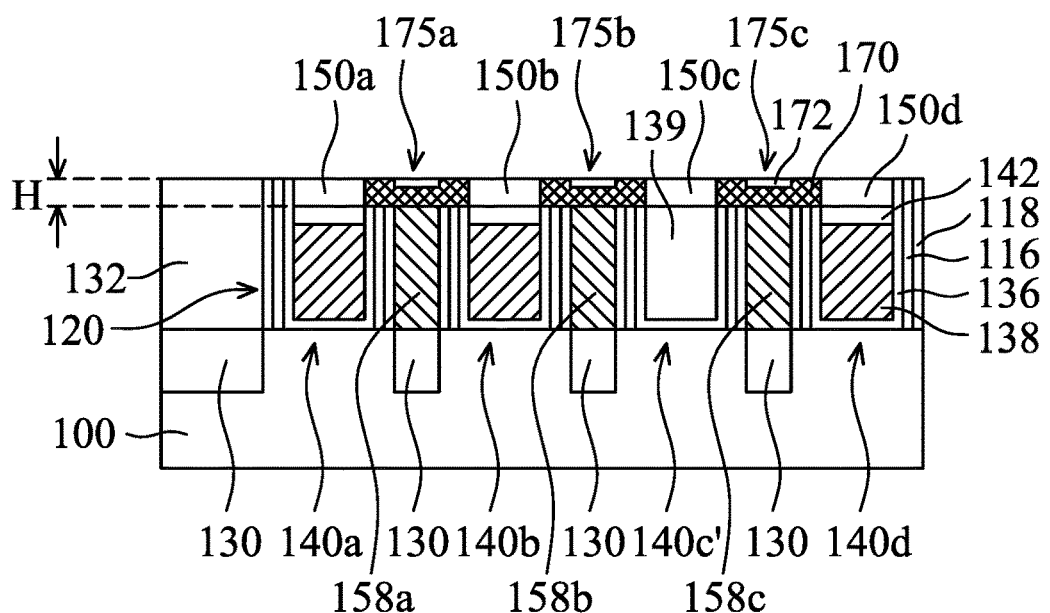
Figure 2M:
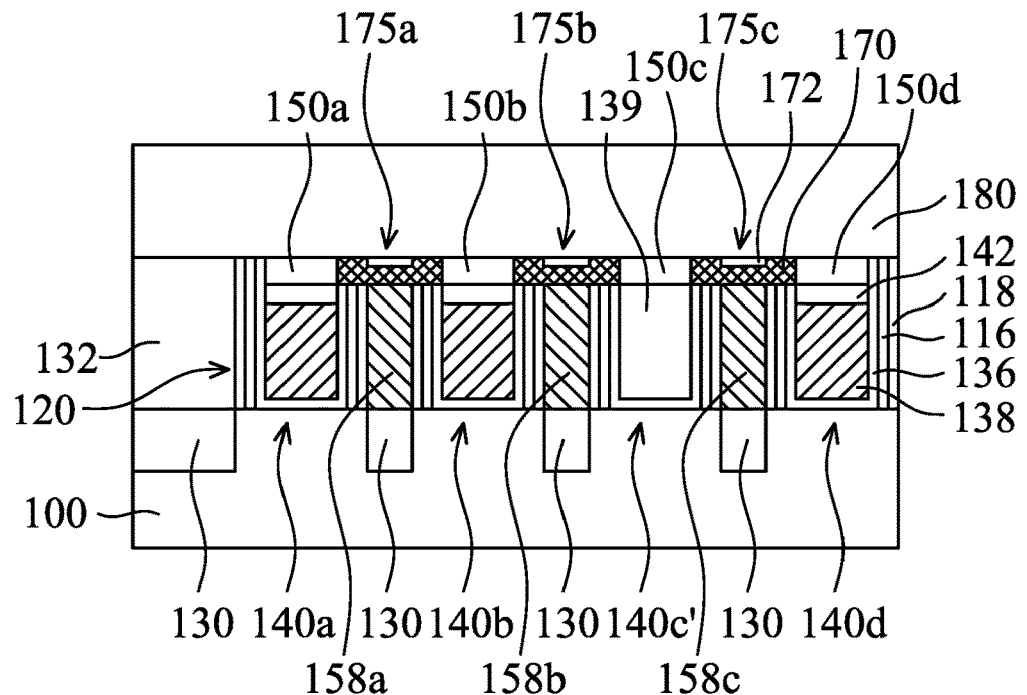
Figure 2N:
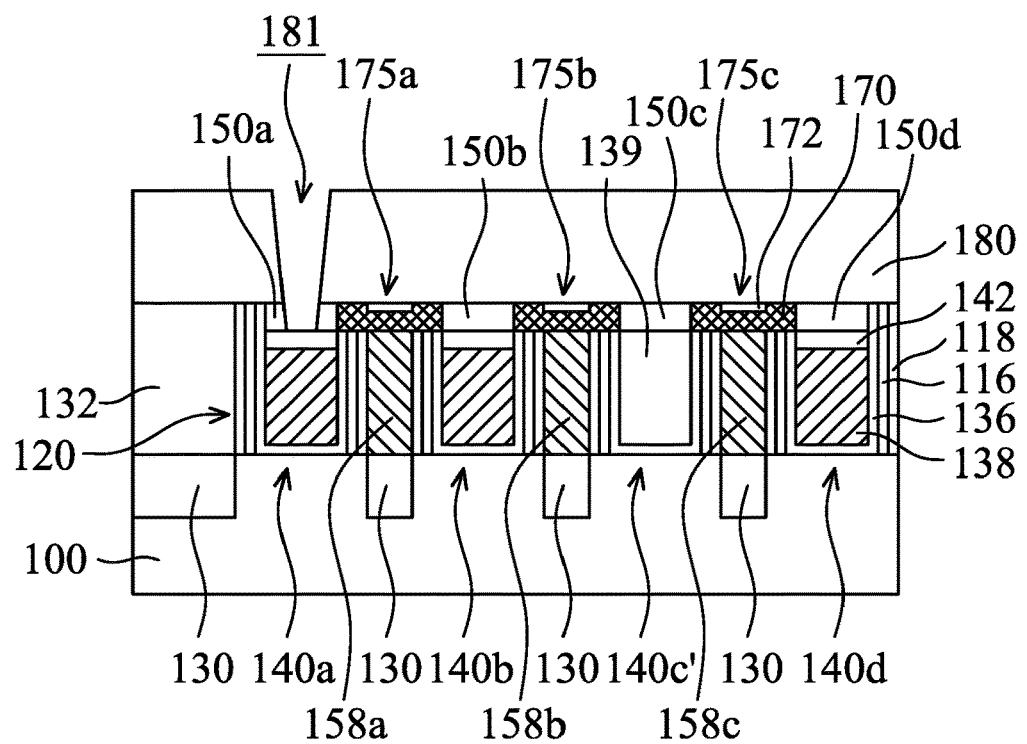
Figure 2O:
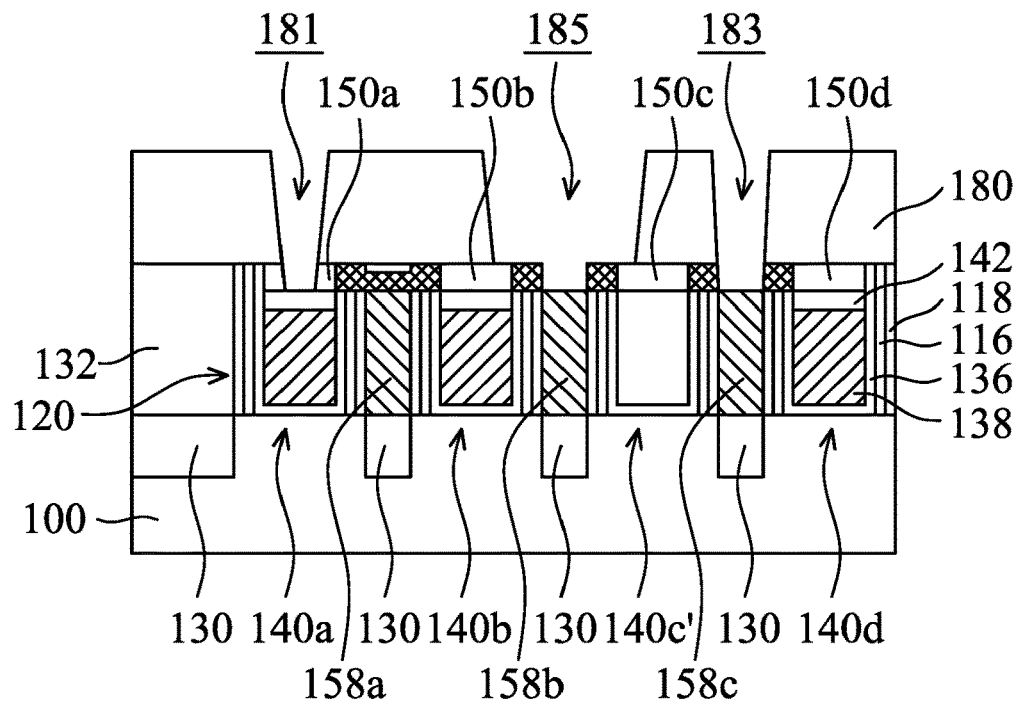
Figure 2P:
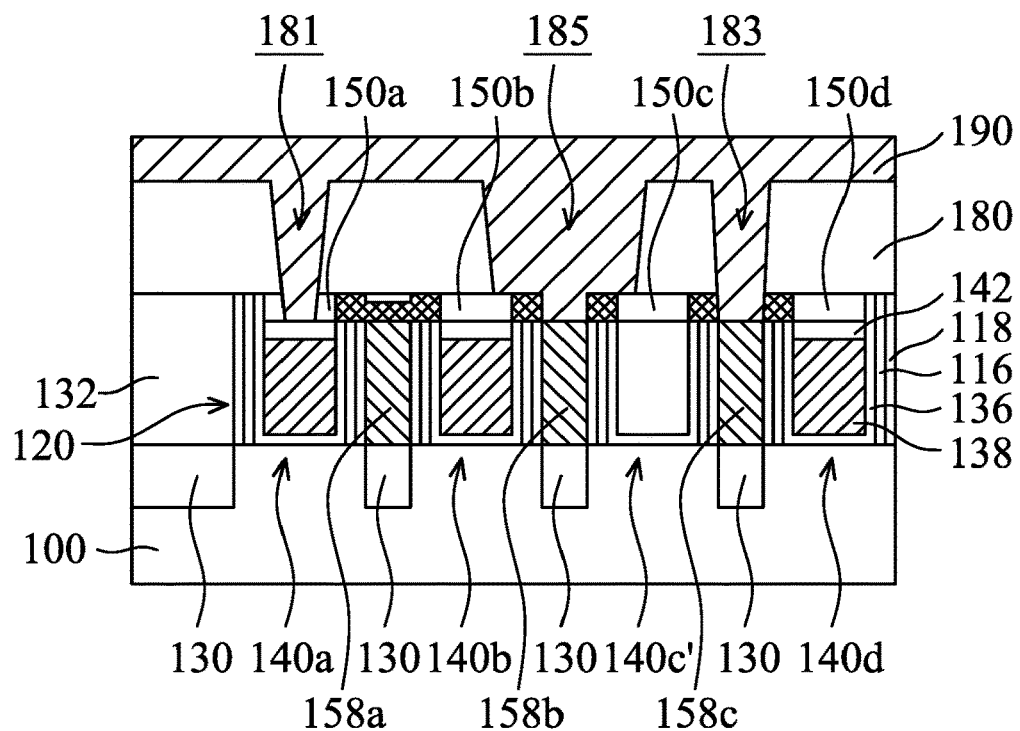
Figure 2Q:
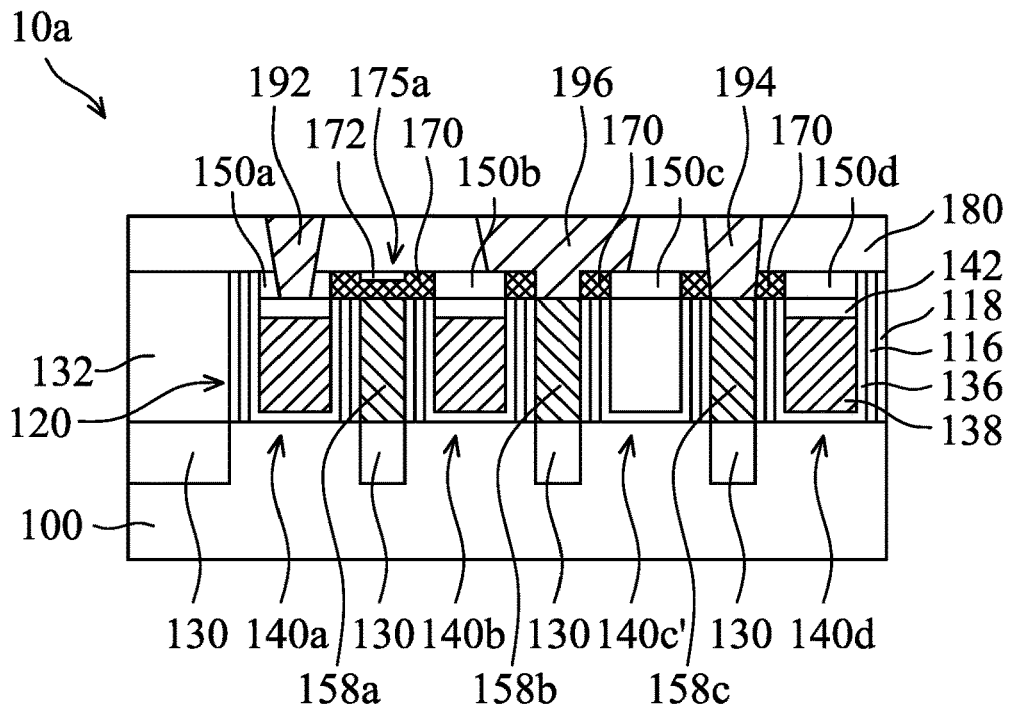

FIGS. 1A to 1D illustrate perspective views of various stages of manufacturing a semiconductor device structure and FIGS. 2A to 2Q illustrate cross-sectional representations of various stages of manufacturing a semiconductor device structure in accordance with some embodiments. In addition, FIGS. 2A to 2D illustrate the cross-sectional representations of the semiconductor device structure shown along line 2-2' in FIGS. 1A to 1D in accordance with some embodiments. In some embodiments, the semiconductor device structure is implemented as a fin field effect transistor (FinFET) structure. As shown in FIGS. 1A and 2A, a substrate 100 is provided. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. In some embodiments, the substrate 100 is a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

In some embodiments, the substrate 100 has a PMOS region for P-type FinFETs formed thereon and/or an NMOS region for N-type FinFETs formed thereon. In some embodiments, the PMOS region of the substrate 100 includes Si, SiGe, SiGeB, or an III-V group semiconductor material (such as InSb, GaSb, or InGaSb). The NMOS region of the substrate 100 includes Si, SiP, SiC, SiPC, or an III-V group semiconductor material (such as InP, GaAs, AlAs, InAs, InAlAs, or InGaAs).

Afterwards, a fin structure 102 and an isolation feature 104 are formed over the substrate 100, as shown in FIG. 1A in accordance with some embodiments. In some embodiments, the substrate 100 is patterned to form the fin structure 102. The fin structure 102 may have slope sidewalls and extend from the substrate 100. In some embodiments, the isolation feature 104 is a shallow trench isolation (STI) structure, and the fin structure 102 is surrounded by the isolation feature 104.

The isolation feature 104 may be formed by depositing an insulating layer (not shown) over the substrate 100 and recessing the insulating layer. The insulating layer for the formation of the isolation feature 104 may be made of silicon oxide, silicon nitride, silicon oxynitride, fluorosilicate glass (FSG), low-K dielectric materials, and/or another suitable dielectric material and may be deposited by a flowable CVD (FCVD) process, a chemical vapor deposition (CVD) process, an atomic layer deposition (ALD) process, or another applicable process.

Afterwards, dummy gate structures 115a, 115b, 115c, and 115d are formed across the fin structure 102 over the substrate 100 and cover the isolation feature 104, as shown in FIG. 1A in accordance with some embodiments. Each of the dummy gate structures 115a, 115b, 115c, and 115d may include a dummy gate dielectric layer 110 and a dummy gate electrode layer 112 formed over the dummy gate dielectric layer 110. In some embodiments, the dummy gate dielectric layer 110 is made of silicon oxide and the dummy gate electrode layer 112 is made of polysilicon.

Gate spacers 120 are formed on the opposite sides (e.g., sidewalls) of the dummy gate structures 115a, 115b, 115c, and 115d after the formation of the dummy gate structures 115a, 115b, 115c, and 115d, in accordance with some embodiments. Each of the gate spacers 120 includes a first spacer layer 116 adjacent to the corresponding dummy gate structure and a second spacer layer 118 adjacent to the first spacer layer 116, as shown in FIGS. 1A and 2A in accordance with some embodiments.

The first spacer layer 116 may be used for protecting dummy gate structures 115a, 115b, 115c, and 115d from damage or loss during subsequent processing. In some embodiments, the first spacer layers 120 are made of low-K dielectric materials, silicon nitride, silicon oxide, silicon oxynitride, silicon carbide, or another applicable dielectric material. The second spacer layer 118 is formed on the corresponding first spacer layer 116 in accordance with some embodiments. In some embodiments, the second spacer layer 118 is made of a material that is different from that of the first spacer layer 116, and includes silicon nitride, silicon oxide, silicon carbide, silicon oxynitride, or another applicable material.

After formation of the gate spacers 120, source/drain features 130 are formed in the fin structure 104 adjacent to and exposed from the dummy gate structures 115a, 115b, 115c, and 115d, as shown in FIGS. 1A and 2A in accordance with some embodiments. In some embodiments, the source/drain structures 114 is formed by recessing the fin structure 102 exposed from the dummy gate structures 115a, 115b, 115c, and 115d and growing semiconductor materials in the formed recesses in the fin structure 102 by performing epitaxial (epi) growth processes. In some embodiments, the semiconductor device structure is an NMOS device, and the source/drain feature 124 includes Si, SiP, SiC, SiPC, or an III-V group semiconductor material (such as InP, GaAs, AlAs, InAs, InAlAs, or InGaAs), or the like. In some embodiments, the semiconductor device structure is a PMOS device, and the source/drain feature 124 includes Si, SiGe, SiGeB, or an III-V group semiconductor material (such as InSb, GaSb, or InGaSb), or the like. In some embodiments, the source/drain features 130 protrude above the isolation feature 104.

An insulating layer 132 is formed over the isolation feature 104 and covers the source/drain features 130 and the isolation feature 104 after the source/drain features 130 are formed, as shown in FIGS. 1B and 2B in accordance with some embodiments. The insulating layer 132 (which serves as an interlayer dielectric (ILD) layer) may be made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 132 may be deposited by any suitable method, such as a chemical vapor deposition (CVD) process, a plasma enhanced CVD (PECVD) process, flowable CND (FCVD) process, the like, or a combination thereof. The insulating layer 132 may be a single layer or include multiple dielectric layers with the same or different dielectric materials.

Afterwards, the dummy gate structures 115a, 115b, 115c, and 115d are removed and replaced by gate structures 140a, 140b, 140c, and 140d, as shown in FIGS. 1B and 2B in accordance with some embodiments. In some embodiments, each of the gate structures 140a, 140b, 140c, and 140d includes a gate dielectric layer 136, a gate electrode layer 138, and the gate spacers 120. The gate dielectric layer 136 may be made of metal oxides, metal nitrides, metal silicates, transition metal-oxides, transition metal-nitrides, transition metal-silicates, oxynitrides of metals, or other applicable dielectric materials.

In some embodiments, the gate electrode layer 138 is made of a conductive material, such as aluminum, copper, tungsten, titanium, tantalum, or another applicable material. Each of the gate structures 140a, 140b, 140c, and 140d may further include a work functional metal layer (not shown)

between the gate dielectric layer 136 and the gate electrode layer 138, so that the gate structures 140a, 140b, 140c, and 140d have the proper work function values. An exemplary p-type work function metal layer may be made of TiN, TaN, Ru, Mo, Al, WN, ZrSi$_2$, MoSi$_2$, TaSi$_2$, NiSi$_2$, WN, or a combination thereof. An exemplary n-type work function metal layer may be made of Ti, Ag, TaAl, TaAlC, TiAlN, TaC, TaCN, TaSiN, Mn, Zr, or a combination thereof.

Afterwards, the gate structures 140a, 140b, 140c, and 140d are recessed by etching, so as to form recesses 141, as shown in FIGS. 1C and 2C in accordance with some embodiments. During the etching, top portions of the gate dielectric layers 130 and the gate spacers 120 are also recessed, so that upper sidewalls of the insulating layer 132 are exposed by the recesses 141 in accordance with some embodiments. In some embodiments, each of the gate electrode layers 138 is further recessed by etching after the upper sidewalls of the insulating layer 132 are exposed, so that the recesses 141 are extended to form a T-shaped profile, as shown in FIG. 2C. As a result, the upper surface of each gate spacer 120 and the upper surface of each gate dielectric layer 130 are higher than the upper surface of the corresponding gate electrode layer 138, as shown in FIGS. 1C and 2C in accordance with some embodiments.

Afterwards, a conductive capping feature 142 is formed to cover each of the recessed gate electrode layers 138, as shown in FIGS. 1C and 2C in accordance with some embodiments. The conductive capping features 142 and the underlying gate electrode layer 138 form gate stacks of the gate structures 140a, 140b, 140c, and 140d. In some embodiments, the upper surface of each gate spacer 120 is higher than the upper surface of each gate stack, as shown in FIGS. 1C and 2C. In some embodiments, the conductive capping features 142 serve as etch stop layers or protective layers for protecting the gate electrode layers 138 from damage or loss during subsequent processing, and are made of a metal material, such as tungsten or fluorine-free tungsten.

After the conductive capping features 142 are formed, a gate cut process is performed to remove one or more gate stacks of the gate structures 140a, 140b, 140c, and 140d in accordance with some embodiments. In some embodiments, the gate stack of the gate structure 140c is removed by etching during the gate cut process, as shown in FIGS. 1C and 2C. Afterwards, an insulating material 139 fills the space that is formed by the removal of the gate stack of the gate structure 140c to form an insulating gate-cut structure 140c' in accordance with some embodiments. The insulating gate-cut structure 140c' includes the gate dielectric layer 136, the insulating material 139, and gate spacers 120 including the first spacer layers 116 and the second spacer layers 118.

The insulating material 139 may include silicon nitride, silicon oxynitride, or silicon carbon nitride, or the like. Alternatively, the insulating material 139 may include hafnium oxide (HfO$_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, and another applicable dielectric material.

After the insulating gate-cut structure 140c' is formed, insulating capping features 150a, 150b, 150d, and 150c are respectively formed in the recesses 141 (not shown and as indicated in FIGS. 1C and 2C) to cover the upper surfaces of the gate structures 140a, 140b, and 140d, and the insulating gate-cut structure 140c', as shown in FIGS. 1D and 2D in accordance with some embodiments. In some embodiments, an insulating layer (not shown) used for formation of the insulating capping features 150a, 150b, 150c, and 150d is formed over the structure shown in FIGS. 1C and 2C and fills the recesses 141. For example, the insulating layer is made of a material different from the material of the insulating layer 132 and includes SiN, SiCN, SiOC, SiON, SiCN, or SiOCN. The insulating layer may be formed by performing a chemical vapor deposition (CVD) process, a plasma enhanced CVD (PECVD) process, low-pressure CVD (LPCVD) process, an atomic layer deposition (ALD) process, or another applicable process. Afterwards, a polishing process is performed to remove the excess insulating layer above the insulating layer 132 in accordance with some embodiments. In some embodiments, such a polishing process is performed on the insulating layer until the insulating layer 132 is exposed and planarized. In some embodiments, the polishing process includes a chemical mechanical polishing (CMP) process. After the polishing process, the remaining insulating layer forms insulating capping features 150a, 150b, 150c, and 150d, as shown in FIG. 2D.

In some embodiments, the upper surfaces of the insulating capping features 150a, 150b, 150c, and 150d are substantially level with the upper surface of the insulating layer 132. The insulating capping features 150a, 150b, and 150d serve as etch stop layers and protect the gate structures 140a, 140b, and 140d in the subsequent manufacturing processes (e.g., etching processes).

After the insulating capping features 150a, 150b, 150c, and 150d are formed, a masking layer 154 is formed over the insulating layer 132 and the insulating capping features 150a, 150b, 150c, and 150d, as shown in FIG. 2E in accordance with some embodiments. In some embodiments, the masking layer 154 includes a tri-layer resist structure including a bottom layer, a middle layer, and a top layer. In order to simplify the diagram, only a flat layer (i.e., the masking layer 154) is depicted.

More specifically, the bottom layer is a first layer of the tri-layer resist structure. The bottom layer may contain a material that is patternable and/or have anti-reflection properties. In some embodiments, the bottom layer is a bottom anti-reflective coating (BARC) layer, such as a nitrogen-free anti-reflective coating (NFARC) layer. In some embodiments, the bottom layer is formed by a spin-on coating process, a chemical vapor deposition (CVD) process, a physical vapor deposition (PVD) process, or another suitable deposition process. The middle layer is formed over the bottom layer and is a second layer of the tri-layer resist structure. The middle layer (which is also referred to as a hard mask layer) provides hard mask properties for the photolithography process. In addition, the middle layer is designed to provide etching selectivity from the bottom layer and the top layer. In some embodiments, the middle layer is made of silicon nitride, silicon oxynitride or silicon oxide and is formed by a spin-on coating process, a chemical vapor deposition (CVD) process, a physical vapor deposition (PVD) process, or another suitable deposition process.

The top layer is formed over the middle layer and is a third layer of the tri-layer resist structure. The top layer may be positive photoresist or negative photoresist. In some other embodiments, the tri-layer resist structure includes oxide-nitride-oxide (ONO) layers.

Afterwards, the tri-layer resist structure (i.e., the masking layer 154) is patterned to form a self-aligned opening 155 which is formed through the masking layer 154 and the insulating layer 132 to expose the upper surfaces of some source/drain features 130, as shown in FIG. 2F in accordance with some embodiments. In some embodiments, the self-aligned opening 155 is formed by etching the masking layer 154 and the insulating layer 132 between the insulating capping features 150a, 150b, 150c, and 150d. During the etching of the insulating layer 132, the insulating capping features 150a, 150b, 150c, and 150d are used as etch masks, so as to define some source/drain contact regions between the gate structures. For example, the source/drain contact regions are between gate structures 140a and 140b, between gate structure 140b and the insulating gate-cut structure 140c', and between the insulating gate-cut structure 140c' and the gate structure 140d. Although some portions of the insulating capping features 150a, 150b, 150c, and 150d may also be removed during the etching for formation of the self-aligned opening 155, the gate structures 140a, 140b, and 140d and the insulating gate-cut structure 140c' are still protected by the insulating capping features 150a, 150b, 150c, and 150d.

After the self-aligned opening 155 is formed, a salicide process may be performed to form salicide layers (not shown) over the exposed the upper surfaces of the source/drain features 130. The salicide layers may be formed by forming a metal layer over the upper surfaces of the source/drain features 130. Afterwards, an annealing process is performed on the metal layer so the metal layer reacts with the source/drain features 130. Afterwards, the unreacted metal layer is removed to form the salicide layers. Examples for forming the metal layer may include Ti, Co, Ni, NiCo, Pt, Ni(Pt), Ir, Pt(Ir), Er, Yb, Pd, Rh, Nb, TiSiN, and the like.

A conductive material 156 is formed over the masking layer 154 and fills the self-aligned opening 155 after the self-aligned opening 155 and the salicide layers (if presented) are formed, as shown in FIG. 2G in accordance with some embodiments. In some embodiments, the conductive material 156 is made of Ru, Ni, Rh, Al, Mo, W, Co, Cu, or metal compound, or the like. The conductive material 156 may be formed by a chemical vapor deposition (CVD) process, a physical vapor deposition, (PVD) process, an atomic layer deposition (ALD) process, an electroless deposition (ELD) process, an electrochemical plating (ECP) process, or another applicable process.

Afterwards, a polishing process is performed to remove the excess conductive material 156 above the insulating capping features 150a, 150b, 150c, and 150d, as shown in FIG. 2H in accordance with some embodiments. In some embodiments, such a polishing process is performed on the conductive material 156 until the insulating capping features 150a, 150b, 150c, and 150d are exposed and planarized. In some embodiments, the polishing process includes a chemical mechanical polishing (CMP) process.

After the polishing process, the masking layer 154 is removed and the remaining conductive material 156 forms a contact structure 158a between and adjacent to the gate structures 140a and 140b, a contact structure 158b between and adjacent to the gate structure 140b and the insulating gate-cut structure 140c', and a contact structure 158c between and adjacent to the gate structure 140d and the insulating gate-cut structure 140c', as shown in FIG. 2H. Those contact structures 158a, 158b and 158c are electrically connected to the corresponding source/drain features 130 and therefore they are also referred to as self-aligned source/drain contact structures or self-aligned source/drain electrodes.

Afterwards, the contact structures 158a, 158b, and 158c are etched to form recesses passing through the insulating capping features 150a, 150b, 150c, and 150d, as shown in FIG. 2I in accordance with some embodiments. In some embodiments, portions of the contact structures 158a, 158b, and 158c are etched, so that a recess 161a is formed between the gate structures 140a and 140b, a recess 161b is formed between the gate structure 140b and the insulating gate-cut structure 140c', and a recess 161c is formed between the insulating gate-cut structure 140c' and the gate structure 140d. As a result, the upper surface 159a of contact structure 158a, the upper surface 159b of contact structure 158b, and the upper surface 159c of contact structure 158c are lower than the upper surface 157a of the insulating capping feature 150a, the upper surface 157b of the insulating capping feature 150b, the upper surface 157c of the insulating capping feature 150c, and the upper surface 157d of the insulating capping feature 150d. In some embodiments, the upper surfaces 159a, 159b, and 159c are substantially level with the upper surfaces 142a of the conductive capping features 142.

After the contact structures 158a, 158b, and 158c are recessed, the recesses 161a, 161b, and 161c are widened, as shown in FIG. 2J in accordance with some embodiments. In some embodiments, portions of the insulating capping features 150a, 150b, 150c, and 150d adjacent to the recesses 161a, 161b, and 161c are removed by etching, so as to expose portions of the gate structures 140a, 140b, and 140d and a portion of the insulating gate-cut structure 140c'. The exposed portions of the gate structures 140a, 140b, and 140d and the portion of the insulating gate-cut structure 140c' include the gate spacers 120 and the gate dielectric layers 136 on opposite sides of the contact structures 158a, 158b, and 158c.

Afterwards, the exposed gate spacers 120 and the exposed gate dielectric layers 136 are also removed by etching in accordance with some embodiments, so that the upper surfaces of the etched gate spacers 120 and the etched gate dielectric layers 136 are substantially level with the upper surface 142a of the conductive capping feature 142 (not shown and as indicated in FIG. 2I) and the upper surfaces 159a, 159b, and 159c (not shown and as indicated in FIG. 2I) of the contact structures 158a, 158b, and 158c. As a result, a widened recess 163a is formed between the gate structures 140a and 140b, a widened recess 163b is formed between the gate structure 140b and the insulating gate-cut structure 140c', and a widened recess 163c is formed between the insulating gate-cut structure 140c' and the gate structure 140d, as shown in FIG. 2J.

After those widened recesses 163a, 163b, and 163c are formed, insulating capping features are respectively formed in the widened recesses 163a, 163b, and 163c (not shown and as indicated in FIG. 2J) in accordance with some embodiments. More specifically, a capping layer 170 is conformally formed over the structure shown in FIG. 2J to cover the insulating layer 132 and the insulating capping features 150a, 150b, 150c, and 150d and extend on and make direct contact with the sidewalls and the bottom of the widened recesses 163a, 163b, and 163c, as shown in FIG. 2K in accordance with some embodiments. In some embodiments, the capping layer 170 is used for formation of the insulating capping features in the widened recesses 163a, 163b, and 163c. In some embodiments, the capping layers 170 has a thickness T that is in a range from about 0.1 nm to about 30 nm. Moreover, the capping layer 170 is made of a material that is different from the material of the insulating capping features 150a, 150b, 150c, and 150d, the material of the gate spacers 120. Therefore, the subsequently formed insulating capping features (which include the capping layer 170) in the widened recesses 163a, 163b, and 163c can provide etch selectivity from the insulating capping features 150a, 150b, 150c, and 150d and/or the gate spacers 120. As a result, such insulating capping features in the widened recesses 163a, 163b, and 163c can provide a hard mask property during etching the capping feature 150a, 150b, 150c, or 150d for formation of a via opening therein.

In some embodiments, the capping layer 170 is made of SiON, Ta$_2$O$_5$, Al$_2$O$_3$, or ZrO$_2$. In some other embodiments, the capping layer 170 is made of Al-containing oxide, N-containing oxide, Hf-containing oxide, Ta-containing oxide, Ti-containing oxide, Zr-containing oxide, La-containing oxide, or another metal-containing oxide or high-K (e.g., K>5) dielectric material. The capping layer 170 may be formed by performing a chemical vapor deposition (CVD) process, a plasma enhanced CVD (PECVD) process, low-pressure CVD (LPCVD) process, an atomic layer deposition (ALD) process, or another applicable process.

After the formation of the capping layer 170, a capping layer 172 is formed over the capping layer 170 and fills the widened recesses 163a, 163b, and 163c, as shown in FIG. 2K in accordance with some embodiments. In some embodiments, the capping layer 172 is also used for formation of the insulating capping features in the widened recesses 163a, 163b, and 163c. The capping layer 172 is made of a material that is different from the material of the capping layer 170, so as to provide etch selectivity from the capping layer 170. As a result, the capping layer 170 in the widened recesses 163a, 163b, and 163c can serve an etch stop layer during subsequent formation of one or more via openings over the corresponding source/drain contact structure(s).

In some embodiments, the capping layer 172 is made of made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 160 may be formed by performing by any suitable deposition method, such as a chemical vapor deposition (CVD) process, a plasma enhanced CVD (PECVD) process, flow/able CVD (FCVD) process, physical vapor deposition, (PVD), atomic layer deposition (ALD), spin-on coating, the like, or a combination thereof.

Afterwards, a polishing process is performed to remove the excess capping layers 172 and 170 above the insulating layer 132 in accordance with some embodiments. In some embodiments, such a polishing process is successively performed on the capping layers 172 and 170 until the upper surface of the gate spacers 120 that are not adjacent to the contact structures 158a and 158b is exposed. In some embodiments, the polishing process includes a chemical mechanical polishing (CMP) process.

After the polishing process, the remaining capping layers 170 and 172 form insulating capping features 175a, 175b, and 175c, as shown in FIG. 2L in accordance with some embodiments. In some embodiments, the insulating capping feature 175a is in direct contact with the insulating capping features 150a and 150b, the insulating capping feature 175b is in direct contact with the insulating capping features 150b and 150c, and the insulating capping feature 175c is in direct contact with the insulating capping features 150c and 150d. In some embodiments, the upper surfaces of the insulating capping features 150a, 150b, 150c, and 150d are substantially level with the upper surfaces of the formed insulating capping features 175a, 175b, and 175c. The insulating capping features 175a, 175b, and 175c respectively cover and in contact with the upper surfaces 159a, 159b, and 159c (not shown and as indicated in FIG. 2I) of the contact structures 158a, 158b, and 158c. In some embodiments, the insulating capping features 175a, 175b, and 175c have a height H equal to the depth of the widened recesses 163a, 163b, and 163c (not shown and as indicated in FIG. 2J). The height H may be in a range from about 0.1 nm to about 50 nm.

In each of the insulating capping features 175a, 175b, and 175c, the capping layers 170 has a U-shaped profile, so that the opposite sidewalk and the bottom of the capping layers 172 is covered by the capping layers 170. The capping layers 172 in each of the insulating capping features 175a, 175b, and 175c serves as an etch stop layer in the subsequent manufacturing processes (e.g., etching processes).

After the insulating capping features 175a, 175b, and 175c are formed, an insulating layer 180 is formed over and covers the insulating layer 132, the insulating capping features 150a, 150b, and 150c, 150d, 175a, 175b, and 175c, as shown in FIG. 2M in accordance with some embodiments. The insulating layer 180 may include a single layer or multilayers and is made of SiO$_2$, SiOC, ZrO$_2$, HfO$_2$, or another applicable dielectric material, or a combination thereof. The insulating layer 180 may serve as an interlayer dielectric (ILD) layer. In some embodiments, the insulating layer 180 is made of a material that is different from the capping layer 170. In some embodiments, the insulating layer 180 is made of a material that is the same as that of the capping layer 172. For example, the insulating layer 180 is made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 160 may be formed by performing by any suitable deposition method, such as a chemical vapor deposition (CVD) process, a plasma enhanced CVD (PECVD) process, flowable CVD (FCVD) process, physical vapor deposition, (PVD), atomic layer deposition (ALD), spin-on coating, the like, or a combination thereof.

After the insulating layer 180 is formed, a via opening 181 that passes through the insulating layer 180 and the insulating capping feature 150a is formed, so as to expose the upper surface 142a (not shown and as indicated in FIG. 2I) of the gate stack in the gate structure 140a, as shown in FIG. 2N in accordance with some embodiments. In some embodiments, the via opening 181 corresponding to the gate structure 140a is formed by performing photolithography and etching processes. For example, an etching process may be performed in the insulating layer 180 using the insulating capping feature 150a as an etch stop layer, so that an opening through the insulating layer 180 is formed to expose a portion of the insulating capping feature 150a.

Afterwards, the exposed portion of the insulating capping feature 150a is etched, so as to extend the via opening 181 and expose the upper surface of the gate structure 140a (e.g., the upper surface 142a of the conductive capping feature 142 in the gate structure 140a). During the etching of the via opening 181, the capping layer 170 of the insulating capping feature 175a provides a hard mask property to prevent the contact structure 158a adjacent to the gate structure 140a from being damaged. As a result, the source/drain contact structure (i.e., the contact structure 158a) can be prevented from being bridged with the subsequent via structure in the via opening 181 even if misalignment occurs in formation of the via opening 181.

After the via opening 181 is formed, a via opening 183 that passes through the insulating layer 180 and the insulating capping feature 175c and a via trench opening 185 that passes through the insulating layer 180 and the corresponding insulating capping feature 175b are formed, as shown in FIG. 2O in accordance with some embodiments.

In some embodiments, the upper surface 159c (not shown and as indicated in FIG. 2I) of the contact structure 158c is exposed through the via opening 183. Also, the upper surface 159b (not shown and as indicated in FIG. 2I) of the contact structure 158b is exposed through the via trench opening 185.

Similarly, the via opening 183 and a via trench opening 185 respectively corresponding to the contact structures 158c and 158b are formed by performing photolithography and etching processes. The via opening 181, the via opening 183, and the via trench opening 185 may have the same depth. As a result, the subsequently formed via structures respectively in the via opening 181, the via opening 183, and the via trench opening 185 have the same vertical heights.

Although the via opening 181 is formed prior to formation of the via opening 183 and the via trench opening 185, the via opening 183 and the via trench opening 185 may be formed prior to formation of the via opening 181, in accordance some embodiments. In addition, although the via opening 183 and the via trench opening 185 are formed simultaneously by the same photolithography and etching processes, the via opening 183 and the via trench opening 185 may be formed by respective photolithography and etching processes, in accordance some other embodiments.

Afterwards, a conductive material 190 is formed over the insulating layer 180 and fills the via openings 181 and 183, and the via trench opening 185, as shown in FIG. 2P in accordance with some embodiments. In some embodiments, the conductive material 190 is made of Ru, Ni, Rh, Al, Mo, W, Co, Cu, or metal compound, or the like. The conductive material 190 may be formed by a chemical vapor deposition (CVD) process, a physical vapor deposition, (PVD) process, an atomic, layer deposition (ALD) process, an electroless deposition (ELD) process, an electrochemical plating (ECP) process, or another applicable process.

After the conductive material 190 is formed, a polishing process is performed on the conductive material 190 until the upper surface of the insulating layer 180 is exposed, in accordance with some embodiments. In some other embodiments, the exposed insulating layer 180 and the remaining conductive material 190 are further polished until the desired thickness of the insulating layer 180 is obtained, as shown in FIG. 2Q. In some embodiments, the polishing process includes a chemical mechanical polishing (CMP) process. After the polishing process, the remaining conductive material 190 in the via openings 181 and 183, and the via trench opening 185 forms conductive via structures 192, 194, and 196. As a result, the semiconductor device structure 10a having the gate structures 140a, 140b, and 140d, the contact structures 158a, 158b, and 158c with insulating caps (e.g., insulating capping features 175a, 175b, and 175c), and the via structures 192, 194, and 196 is formed.

In some embodiments, the via structure 192 is formed in and surrounded by the insulating layer 180 and the insulating capping feature 150a and electrically connected to the gate structure 140a via the conductive capping feature 142 that is formed between the gate electrode layer 138 and the via structure 192. In some embodiments, the via structure 194 and the via structure 196 are formed in and surrounded by the insulating layer 180 and respectively and electrically connected to the contact structures 158c and 158b. Moreover, the via structure 196 is overlapped with the contact structure 158b, the gate structure 158b, and the insulating gate-cut structure 140c', in accordance with some embodiments. In some embodiments, the via structures 192, 194, and 196 have upper surfaces that are substantially level with the upper surface of the insulating layer 180, as shown in FIG. 2Q.

Since the insulating capping feature 150a and the capping layers 170 in the insulating capping features 175a, 175b, and 175c can serve as etch stop layers during the formation of via openings 181 and 183 and the via trench opening 185 in the insulating layer 180, there is no need to form an etch stop layer between the insulating layer 180 and insulating capping features 150a, 175a, 175b, and 175c. As a result, the etching for the definition of via openings 181 and 183 and the via trench opening 185 can be simplified. In addition, since such an etch stop layer is omitted and the insulating layer 180 is thinned to the desired thickness, the height of the formed via structures 194 and 196 can be reduced. As a result, the resistances of the via structures 194 and 196 can be reduced to increase the device performance.

Figure 3:
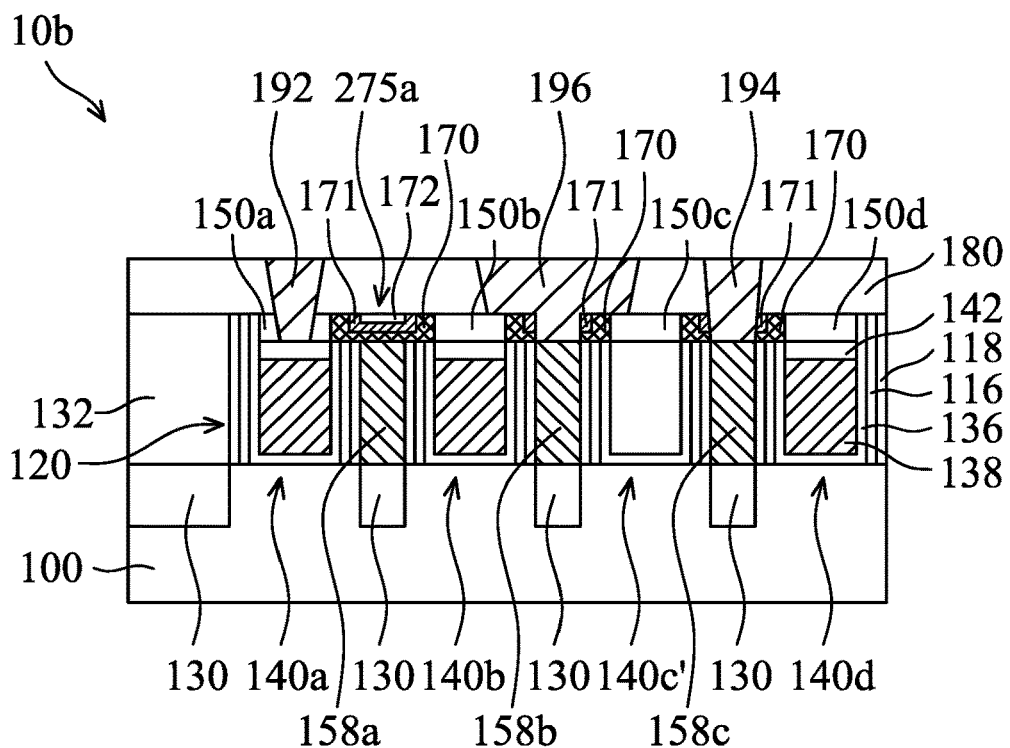
FIG. 3 illustrates a cross-sectional representation of a semiconductor device structure in accordance with some embodiments.

Many variations and/or modifications can be made to embodiments of the disclosure. FIG. 3 shows a cross-sectional representation of a semiconductor device structure 10b, in accordance with some embodiments. The semiconductor device structure 10b shown in FIG. 3 is similar to the semiconductor device structure 10a shown in FIG. 2Q. In some embodiments, the materials, formation methods, and/or benefits of the semiconductor device structure 10a shown in FIGS. 2A to 2Q may also be applied in the embodiments illustrated in FIG. 3, and are therefore not repeated.

Unlike the insulating capping feature 175a in the semiconductor device structure 10a shown in FIG. 2Q, the insulating capping feature 275a in the semiconductor device structure 10b shown in FIG. 3 further includes a capping layer 171 formed between the capping layer 170 and the capping layer 172, in accordance with some embodiments. In some embodiments, the formation of the insulating capping feature 275a includes successively and conformally forming the capping layers 170 and 171 in the widened recess 163a (not shown and as indicated in FIG. 2J). Afterwards, the capping layer 172 is formed over the capping layer 171 in the widened recess 163a, so that the opposite sidewalls and the bottom of the capping layer 172 are covered by the capping layers 171 and 170.

In some embodiments, the capping layers 170, 171, and 172 are made of different materials. In some embodiments, the material of the capping layer 171 includes SiON, $Ta_2O_5$, $Al_2O_3$, or $ZrO_2$, Al-containing oxide, N-containing oxide, Hf-containing oxide, Ta-containing oxide, Ti-containing oxide, Zr-containing oxide, La-containing oxide, or another metal-containing oxide or high-K (e.g., K>5) dielectric material.

Figure 4:
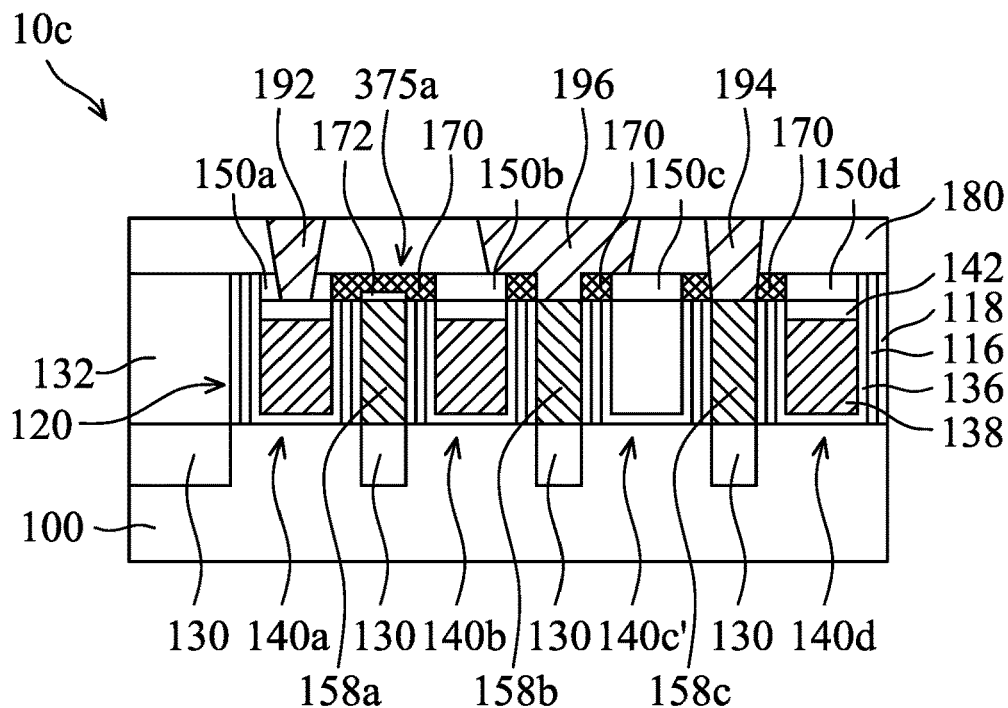
FIG. 4 illustrates a cross-sectional representation of a semiconductor device structure in accordance with some embodiments.

FIG. 4 shows a cross-sectional representation of a semiconductor device structure 10c, in accordance with some embodiments. The semiconductor device structure 10c shown in FIG. 4 is similar to the semiconductor device structure 10a shown in FIG. 2Q. In some embodiments, the materials, formation methods, and/or benefits of the semiconductor device structure 10a shown in FIGS. 2A to 2Q may also be applied in the embodiments illustrated in FIG. 4, and are therefore not repeated.

Unlike the insulating capping feature 175a in the semiconductor device structure 10a shown in FIG. 2Q, the capping layer 170 in the insulating capping feature 375a in the semiconductor device structure 10c shown in FIG. 4 has a reversed U-shaped profile, in accordance with some embodiments. The reversed U-shaped capping layer 170 covers the opposite sidewalls of the capping layer 172 and extends between the capping layer 172 and the insulating layer 180 to cover the top of the capping layer 172, in accordance with some embodiments. In some embodiments, the formation of the insulating capping feature 375a includes forming the capping layer 172 in the widened recess that are formed between the insulating capping features 150a and 150b. Afterwards, the reversed U-shaped capping layer 170 is formed over the capping layer 172 in the widened recess, so that the opposite sidewalls and the top of the capping layer 172 are covered by the capping layer 170.

Figure 5:
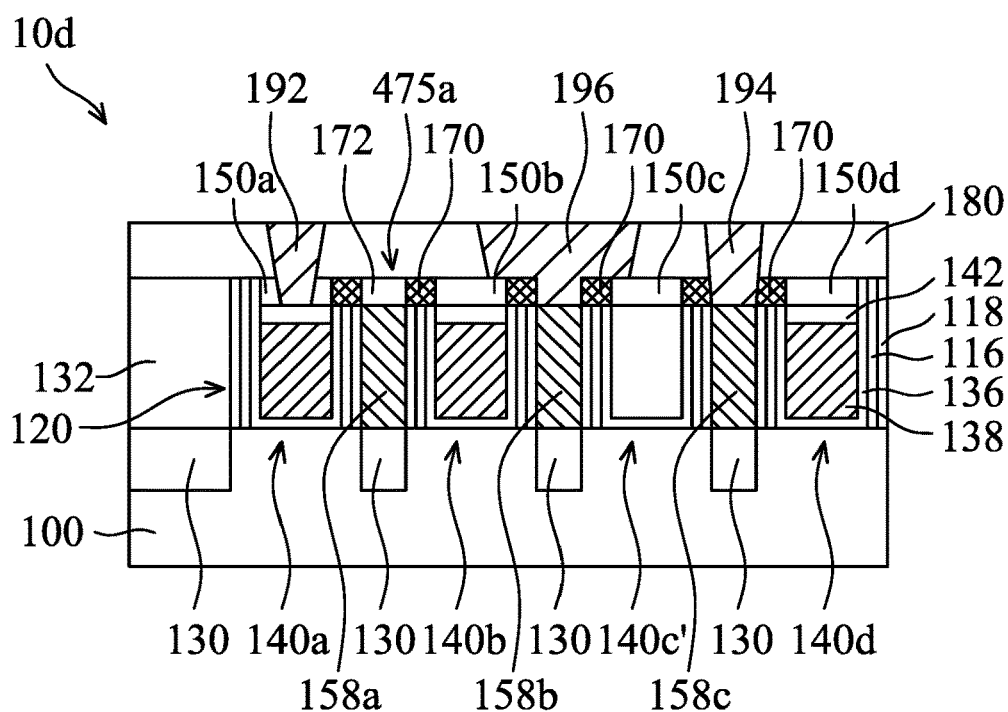
FIG. 5 illustrates a cross-sectional representation of a semiconductor device structure in accordance with some embodiments.

FIG. 5 shows a cross-sectional representation of a semiconductor device structure 10d, in accordance with some embodiments. The semiconductor device structure 10d shown in FIG. 5 is similar to the semiconductor device structure 10a shown in FIG. 2Q. In some embodiments, the materials, formation methods, and/or benefits of the semiconductor device structure 10a shown in FIGS. 2A to 2Q may also be applied in the embodiments illustrated in FIG. 5, and are therefore not repeated.

Unlike the insulating capping feature 175a in the semiconductor device structure 10a shown in FIG. 2Q, the capping layer 170 in the insulating capping feature 475a in the semiconductor device structure 10d shown in FIG. 5 covers the opposite sidewalls of the capping layer 172 and does not cover the bottom of the capping layer 172, in accordance with some embodiments. In some embodiments, the capping layer 170 has a height that is substantially equal to a height of the capping layer 172 and forms spacers on opposite sidewalls of the capping layer 172. In some embodiments, the formation of the insulating capping feature 475a includes conformally forming the capping layer 170 in the widened recess that is formed between the insulating capping features 150a and 150b. Afterwards, the capping layer 170 on the bottom of each of the widened recess is removed to leave the capping layer 170 on the opposite sidewalk of the widened recess. Afterwards, the widened recess is filled with the capping layer 172, so that the opposite sidewalls of the capping layer 172 are covered by the capping layer 170.

Figure 6:
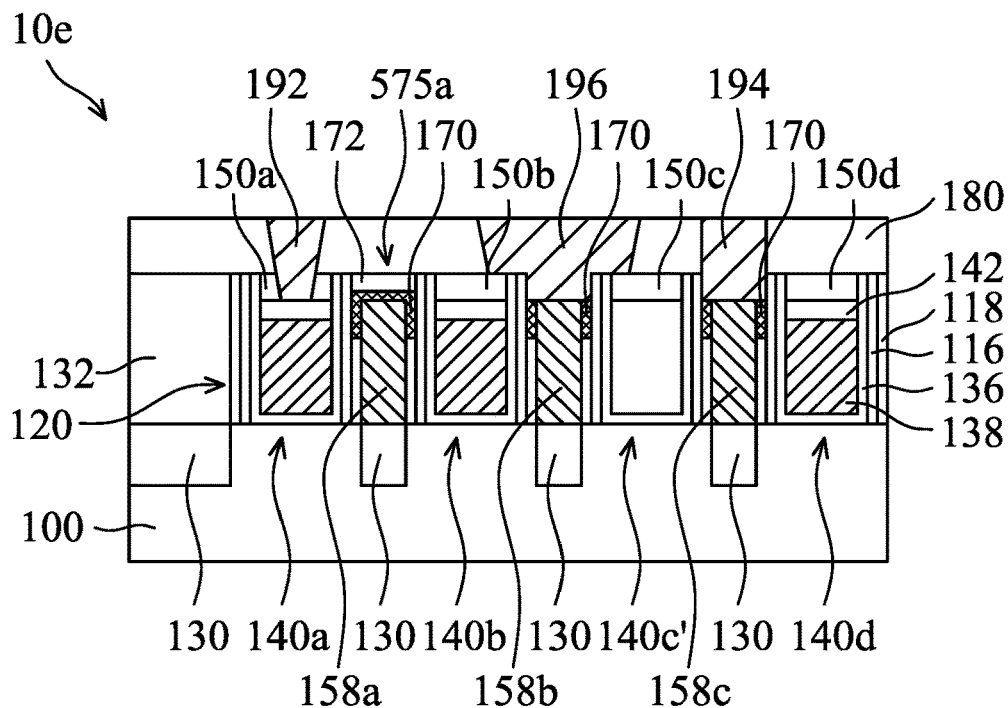
FIG. 6 illustrates a cross-sectional representation of a semiconductor device structure in accordance with some embodiments.

FIG. 6 shows a cross-sectional representation of a semiconductor device structure 10e, in accordance with some embodiments. The semiconductor device structure 10e shown in FIG. 6 is similar to the semiconductor device structure 10a shown in FIG. 2Q. In some embodiments, the materials, formation methods, and/or benefits of the semiconductor device structure 10a shown in FIGS. 2A to 2Q may also be applied in the embodiments illustrated in FIG. 6, and are therefore not repeated.

Unlike the insulating capping feature 175a in the semiconductor device structure 10a shown in FIG. 2Q, the capping layer 170 in the insulating capping feature 575a in the semiconductor device structure 10e shown in FIG. 6 has a reversed U-shaped profile, in accordance with some embodiments. In some embodiments, the reversed U-shaped capping layer 170 is formed between the capping layer 172 and the contact structure 158a and extends on the opposite sidewalls of the contact structure 158a and extends between the capping layer 172 and the contact structure 158a, so as to cover the upper surface of the contact structure 158a. In some embodiments, the formation of the insulating capping feature 575a includes partially removing portions (e.g., the second spacer layers 118) of the gate structures 140a and 140b that are exposed from the widened recess between the insulating capping features 150a and 150b. As a result, the opposite sidewalls of the contact structure 158a is partially exposed. Afterwards, the reversed U-shaped capping layer 170 is conformally forming in the widened recess to cover the exposed portions of the opposite sidewalk and the top of the contact structure 158a. Afterwards, the capping layer 172 is formed over the capping layer 170 in the widened recess.

Figure 7:
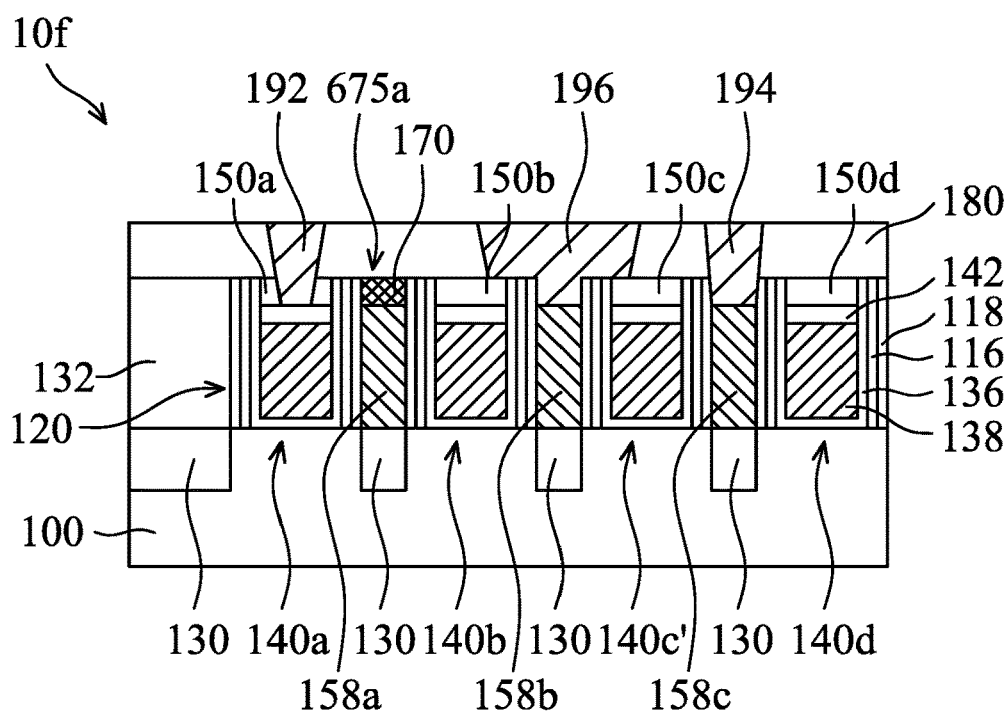
FIG. 7 illustrates a cross-sectional representation of a semiconductor device structure in accordance with some embodiments.

FIG. 7 shows a cross-sectional representation of a semiconductor device structure 10f, in accordance with some embodiments. The semiconductor device structure 10f shown in FIG. 7 is similar to the semiconductor device structure 10a shown in FIG. 2Q. In some embodiments, the materials, formation methods, and/or benefits of the semiconductor device structure 10a shown in FIGS. 2A to 2Q may also be applied in the embodiments illustrated in FIG. 7, and are therefore not repeated.

Unlike the insulating capping feature 175a in the semiconductor device structure 10a shown in FIG. 2Q, the insulating capping feature 675a in the semiconductor device structure 10f shown in FIG. 7 has a rectangular profile and is formed of the capping layer 170, in accordance with some embodiments. In some embodiments, the rectangular insulating capping feature 675a formed of the capping layer 170 fills the recess between the insulating capping features 150a and 150b, and the gate spacers 120 between the gate structures 140a and 140b protrude from the upper surface of the contact structures 142 of the gate structures 140a and 140b. As a result, such gate spacers 120 are formed between the insulating capping features 150a and 675a and between the insulating capping features 150b and 675a.

Embodiments of semiconductor device structures and methods for forming the same are provided. The formation of the semiconductor device structure includes forming a first insulating capping feature over a gate stack and forming a second insulating capping feature over a contact structure and adjacent to the gate stack. The second insulating capping feature includes a material different from that of the first insulating capping feature. Afterwards, an insulating layer covers the first and second insulating capping features. The second insulating capping feature serves a hard mask during the definition of a via opening in the insulating layer above the gate stack, thereby providing good isolation between the contact structure and the subsequently formed via structure over the gate stack. Therefore, the contact structure can be prevented from being bridged with the subsequently formed via structure. The first and second insulating capping features can serve as etch stop layers during the definition of via openings in the insulating layer. Therefore, there is no need to form an etch stop layer between the insulating layer and the first and second insulating capping features. As a result, the etching for the definition of via openings can be simplified. The height of the subsequently formed via structures can be reduced, thereby reducing the resistances of the via structures to increase the device performance.

In some embodiments, a semiconductor device structure is provided. The semiconductor device structure includes a conductive gate stack formed over a substrate. The semiconductor device structure also includes a gate dielectric layer covering opposite sidewalls and a bottom of the conductive gate stack. The semiconductor device structure further includes a first gate spacer layer and a second gate spacer layer respectively covering portions of the gate dielectric layer corresponding to the opposite sidewalls of the conductive gate stack. In addition, the semiconductor device structure includes a source/drain contact structure separated from the conductive gate stack by the gate dielectric layer and the first gate spacer layer. The semiconductor device structure also includes a first insulating capping feature covering the conductive gate stack and separated from the second gate spacer layer by the gate dielectric layer, and a second insulating capping feature covering the source/ drain contact structure. An upper surface of the second insulating capping feature is substantially level with an upper surface of the first insulating capping feature.

In some embodiments, a semiconductor device structure is provided. The semiconductor device structure includes a fin structure over a substrate and a contact structure electrically connected to a source/drain feature in the fin structure. The semiconductor device structure also includes a gate structure across the fin structure and adjacent to the contact structure. The gate structure includes a gate electrode layer and a conductive capping feature formed over the gate electrode layer. An upper surface of the conductive capping feature is substantially level with an upper surface of the contact structure. The semiconductor device structure further includes a first insulating capping feature in contact with the conductive capping feature. In addition, the semiconductor device structure includes a second insulating capping feature passing through the first insulating capping feature to contact the contact structure.

In some embodiments, a semiconductor device structure is provided. The semiconductor device structure includes a gate electrode layer across a fin structure of a substrate. The semiconductor device structure also includes a first insulating capping feature formed over the gate electrode layer. The semiconductor device structure further includes a contact structure electrically connected to a source/drain feature in the fin structure. In addition, the semiconductor device structure includes a second insulating capping feature formed over the contact structure. An upper surface of the contact structure is higher than an upper surface of the electrode layer. An upper surface of the first insulating capping feature is substantially level with an upper surface of the second insulating capping feature. A sidewall of the first insulating capping feature is in direct contact with a sidewall of the second insulating capping feature.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a conductive gate stack formed over a substrate;
a gate dielectric layer covering opposite sidewalls and a bottom of the conductive gate stack;
a first gate spacer layer and a second gate spacer layer respectively covering portions of the gate dielectric layer corresponding to the opposite sidewalls of the conductive gate stack;
a source/drain contact structure separated from the conductive gate stack by the gate dielectric layer and the first gate spacer layer;
a first insulating capping feature covering the conductive gate stack, wherein the first insulating capping feature is adjacent to the gate dielectric layer and spaced apart from the second gate spacer layer by the gate dielectric layer; and
a second insulating capping feature covering the source/drain contact structure, wherein an upper surface of the second insulating capping feature is substantially level with an upper surface of the first insulating capping feature.

2. The semiconductor device structure as claimed in claim 1, wherein a lower surface of the second insulating capping feature is substantially level with an upper surface of the first gate spacer layer.

3. The semiconductor device structure as claimed in claim 1, wherein the second insulating capping feature extends over the first gate spacer layer, and wherein a sidewall of the second insulating capping feature is in direct contact with a sidewall of the first insulating capping feature.

4. The semiconductor device structure as claimed in claim 1, wherein the second insulating capping feature comprises:
a first capping layer; and
a second capping layer covering opposite sidewalls of the first capping layer.

5. The semiconductor device structure as claimed in claim 4, wherein the second capping layer extends between the first capping layer and the source/drain contact structure.

6. The semiconductor device structure as claimed in claim 4, wherein the second insulating capping feature further comprises:
a third capping layer formed between the first capping layer and the second capping layer.

7. The semiconductor device structure as claimed in claim 4, wherein the second capping layer extends over a top of the first capping layer.

8. The semiconductor device structure as claimed in claim 4, wherein an upper surface and a lower surface of the first capping layer are respectively and substantially level with an upper surface and a lower surface of the second capping layer.

9. The semiconductor device structure as claimed in claim 1, wherein the second insulating capping feature comprises:
a first capping layer; and
a second capping layer formed between the first capping layer and the source/drain contact structure, and extending on opposite sidewalls of the source/drain contact structure.

10. The semiconductor device structure as claimed in claim 1, wherein the gate stack comprises:
a gate electrode layer; and
a conductive capping feature between the gate electrode layer and the first insulating capping feature.

11. A semiconductor device structure, comprising:
a fin structure over a substrate;
a contact structure electrically connected to a source/drain feature in the fin structure;
a gate structure across the fin structure and adjacent to the contact structure, comprising:
a gate electrode layer; and a conductive capping feature formed over the gate electrode layer, wherein an upper surface of the conductive capping feature is substantially level with an upper surface of the contact structure;

a first insulating capping feature in contact with the conductive capping feature; and a second insulating capping feature passing through the first insulating capping feature to contact the contact structure.

12. The semiconductor device structure as claimed in claim 11, wherein the second insulating capping feature comprises:

a first capping layer; and a second capping layer covering opposite sidewalls and a bottom or a top of the first capping layer.

13. The semiconductor device structure as claimed in claim 11, wherein the second insulating capping feature comprises:

a first capping layer;

a second capping layer covering opposite sidewalls and a bottom of the first capping layer; and a third capping layer formed between the first capping layer and the second capping layer.

14. The semiconductor device structure as claimed in claim 11, wherein the second insulating capping feature comprises:

a first capping layer; and a second capping layer covering opposite sidewalls of the first capping layer, wherein the second capping layer has a height that is substantially equal to a height of the first capping layer.

15. The semiconductor device structure as claimed in claim 11, wherein the second insulating capping feature comprises:

a first capping layer; and a second capping layer formed below the first capping layer and covering opposite sidewalls and an upper surface of the contact structure.

16. A semiconductor device structure, comprising:

a gate electrode layer across a fin structure of a substrate;

a first insulating capping feature formed over the gate electrode layer;

a contact structure electrically connected to a source/drain feature in the fin structure; and a second insulating capping feature formed over the contact structure, wherein an upper surface of the contact structure is higher than an upper surface of the electrode layer, wherein an upper surface of the first insulating capping feature is substantially level with an upper surface of the second insulating capping feature, and wherein a sidewall of the first insulating capping feature is in direct contact with a sidewall of the second insulating capping feature.

17. The semiconductor device structure as claimed in claim 16, further comprising:

a conductive capping feature formed between the gate electrode layer and the first insulating capping feature, wherein an upper surface of the conductive capping feature is substantially level with the upper surface of the contact structure.

18. The semiconductor device structure as claimed in claim 17, wherein the second insulating capping feature comprises:

a first capping layer; and a second capping layer covering opposite sidewalls of the first capping layer.

19. The semiconductor device structure as claimed in claim 18, wherein the second insulating capping feature further comprises:

a third capping layer formed between the first capping layer and the second capping layer.

20. The semiconductor device structure as claimed in claim 16, further comprising:

an insulating layer covering the upper surface of the first insulating capping feature and the upper face of the first insulating capping feature;

a first conductive via structure in the insulating layer and electrically connected to the gate electrode layer; and a second conductive via structure in the insulating layer and electrically connected to the contact structure, wherein a height of the first conductive via structure is substantially equal to a height of the second conductive via structure.

* * * * *